United States Patent
Namba et al.

(10) Patent No.: US 8,466,716 B2
(45) Date of Patent: Jun. 18, 2013

(54) SYNTHESIZER, SYNTHESIZER MODULE, AND RECEPTION DEVICE AND ELECTRONIC DEVICE USING SAME

(75) Inventors: Akihiko Namba, Osaka (JP); Takeshi Fujii, Osaka (JP); Yasunobu Tsukio, Osaka (JP)

(73) Assignee: Panasonic Corporation, Osaka (JP)

( * ) Notice: Subject to any disclaimer, the term of this patent is extended or adjusted under 35 U.S.C. 154(b) by 199 days.

(21) Appl. No.: 12/742,793

(22) PCT Filed: Nov. 11, 2008

(86) PCT No.: PCT/JP2008/003256
§ 371 (c)(1),
(2), (4) Date: May 13, 2010

(87) PCT Pub. No.: WO2009/063612
PCT Pub. Date: May 22, 2009

(65) Prior Publication Data
US 2010/0271088 A1    Oct. 28, 2010

(30) Foreign Application Priority Data
Nov. 14, 2007   (JP) ................................. 2007-295428

(51) Int. Cl.
*H03B 21/00*   (2006.01)
(52) U.S. Cl.
USPC .......................................... 327/105; 327/107
(58) Field of Classification Search
USPC .......... 327/105–107, 141, 147–150, 156–159
See application file for complete search history.

(56) References Cited

U.S. PATENT DOCUMENTS

| | | | |
|---|---|---|---|
| 7,103,132 B1 | 9/2006 | Baba | |
| 7,830,954 B2* | 11/2010 | Welz et al. | ..................... 375/219 |
| 2004/0232995 A1* | 11/2004 | Thomsen et al. | ................. 331/2 |
| 2007/0035344 A1 | 2/2007 | Kobayashi | |

FOREIGN PATENT DOCUMENTS

| | | |
|---|---|---|
| JP | 3-209917 A | 9/1991 |
| JP | 10-28051 A | 1/1998 |
| JP | 2000-312149 A | 11/2000 |
| JP | 2003-69426 A | 3/2003 |
| JP | 2007-175577 A | 7/2007 |
| WO | WO 2004/084403 A1 | 9/2004 |

OTHER PUBLICATIONS

International Search Report for PCT/JP2008/003256, Feb. 17, 2009.

* cited by examiner

*Primary Examiner* — Lincoln Donovan
*Assistant Examiner* — Diana J Cheng
(74) *Attorney, Agent, or Firm* — RatnerPrestia

(57) ABSTRACT

A synthesizer including an oscillator for outputting an oscillation signal based on an output signal from a comparator, a frequency divider for dividing a frequency of an output signal from the oscillator based on control from a controller, and a temperature sensor for detecting an error between a preset frequency and a frequency based on a reference oscillation signal. The comparator compares an output signal from the frequency divider with an output signal from a MEMS oscillator and outputs a signal indicating the comparison result to the oscillator. The controller changes the frequency division ratio of the frequency divider based on an output signal from the temperature sensor and changes the frequency division ratio in a state in which the frequency division ratio is kept at the past value. Thus, phase noise deterioration in the synthesizer can be suppressed.

17 Claims, 17 Drawing Sheets

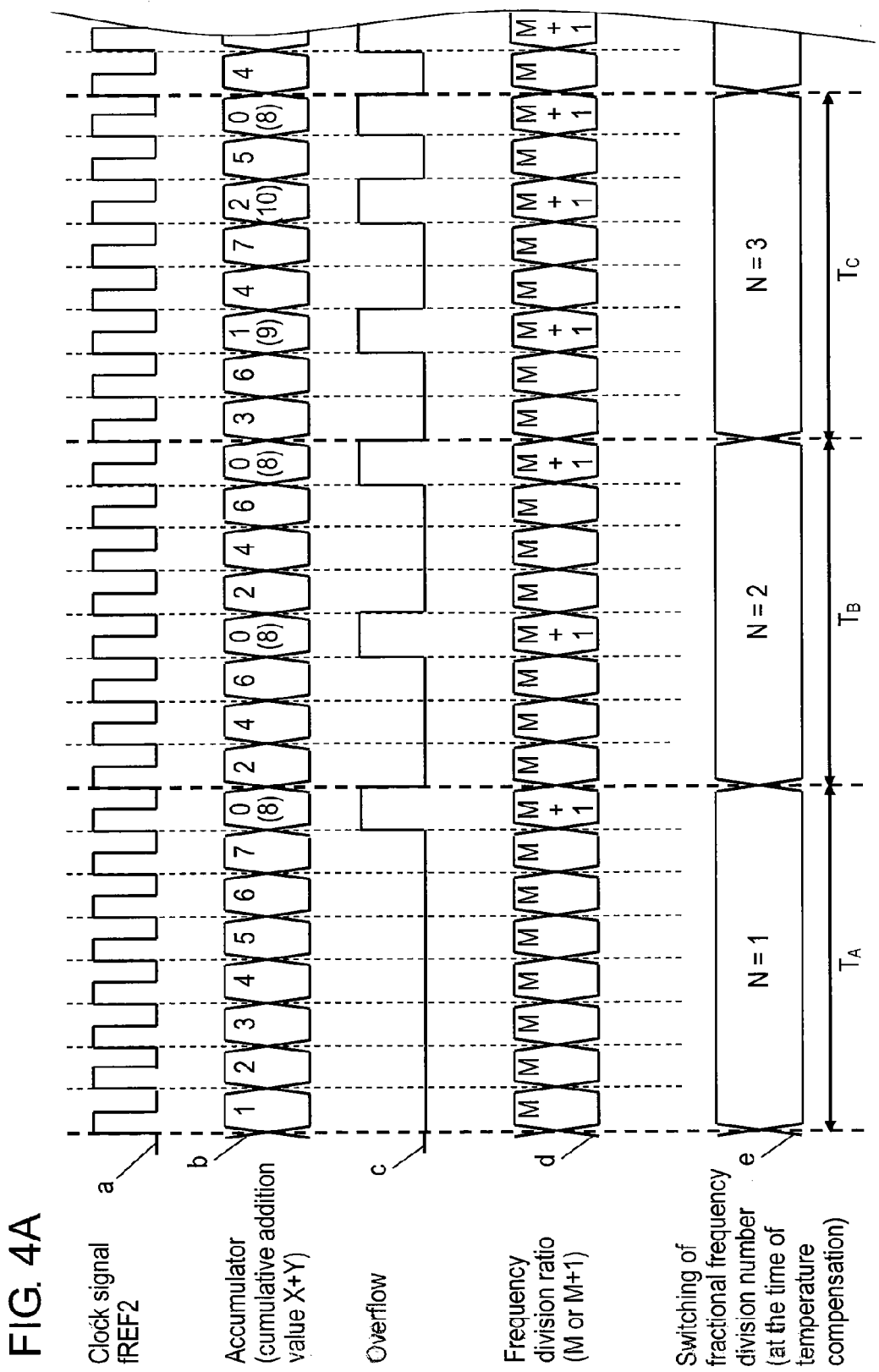

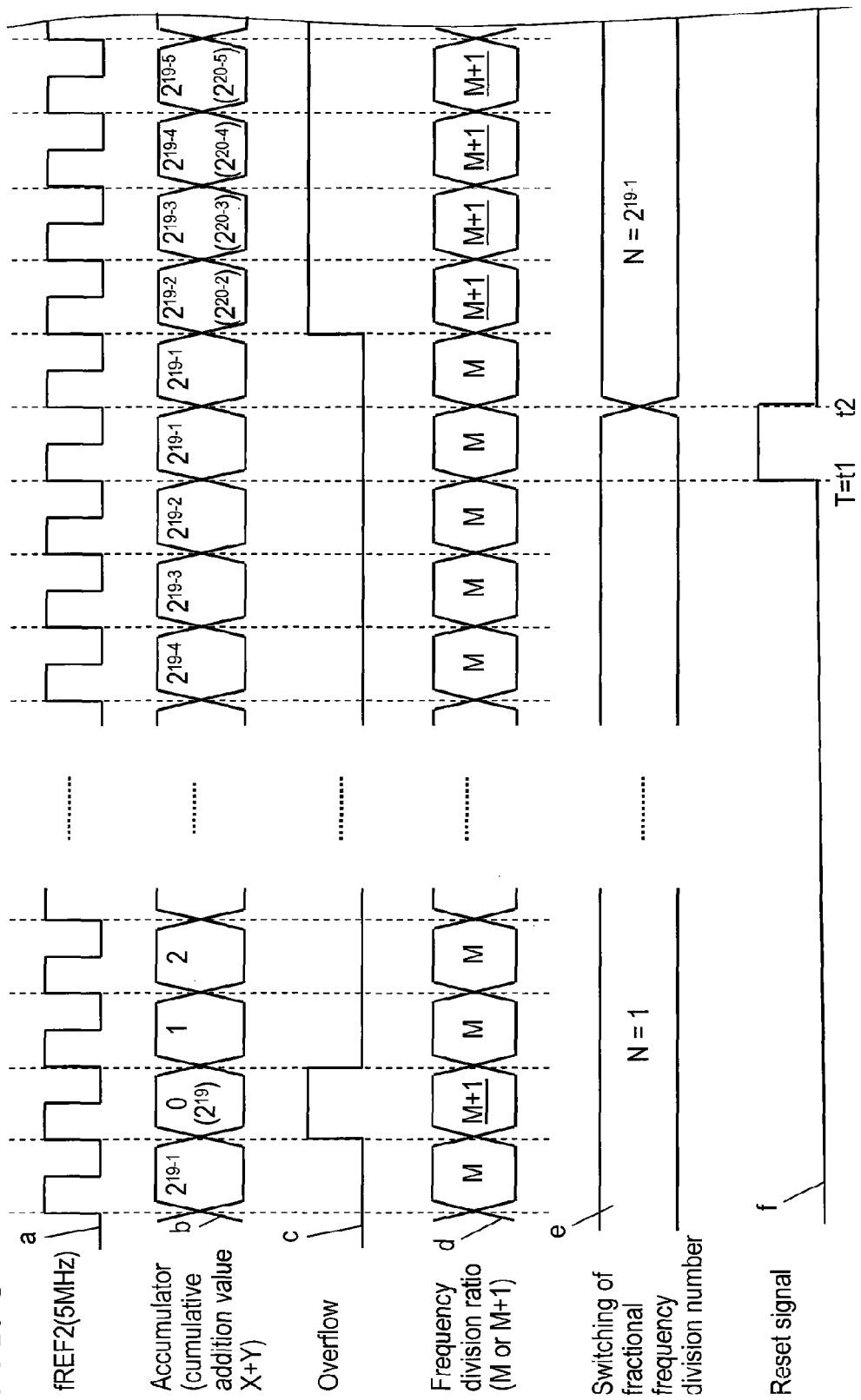

SYNTHESIZER, SYNTHESIZER MODULE, AND RECEPTION DEVICE AND ELECTRONIC DEVICE USING SAME

This application is a U.S. National Phase Application of PCT International Application PCT/JP2008/003256.

TECHNICAL FIELD

The present invention relates to a synthesizer, a synthesizer module, and a receiver and an electronic device using the same.

BACKGROUND ART

A conventional synthesizer carrying out temperature compensation of a reference oscillator is described hereinafter with reference to FIG. 14, which is disclosed in, for example, Patent Document 1.

FIG. 14 is a block diagram showing a conventional synthesizer carrying out temperature compensation of a reference oscillator. In conventional synthesizer 100 shown in FIG. 14, a reference oscillation signal output from reference frequency oscillator 101 is divided by first frequency divider 102, and then input into comparator 103. Furthermore, an output signal from comparator 103 is integrated in low-pass filter 104, and converted into a signal having a frequency near a direct current. Based on a voltage value of this signal, voltage control oscillator 105 outputs an oscillation signal as a local signal. Furthermore, voltage control oscillator 105 inputs an oscillation signal into second frequency divider 106. Second frequency divider 106 divides a frequency of the oscillation signal by a frequency division number designated by control circuit 107 according to channel designation, and outputs a signal into comparator 103. Comparator 103 compares the signal input from second frequency divider 106 with the signal input from first frequency divider 102.

The above-mentioned operation is an operation of a basic synthesizer. In synthesizer 100 shown in FIG. 14, the frequency division number of second frequency divider 106 is controlled by a temperature sensed by temperature sensor 108. The operation thereof is described briefly. Temperature sensor 108 detects an ambient temperature. The temperature is converted into a digital signal by A/D (analog/digital) converter 109. A predetermined correction value according to an output from A/D converter 109 is read out from memory 110 such as EEPROM (Electrically Erasable Programmable Read Only Memory) storing temperature-corrected values in advance, and is output to control circuit 107. Control circuit 107 changes the frequency division number of second frequency divider 106 according to the correction value output from memory 110.

Second frequency divider 106 includes an accumulator. A frequency division number is changed by inputting a frequency division number into the accumulator. FIG. 15 is a configuration diagram showing a conventional accumulator in second frequency divider 106. With reference to FIG. 15, a conventional method of changing a frequency division number is described by using a 19-bit binary accumulator as an example.

In FIG. 15, conventional accumulator 111 includes first flip-flop 113 for temporarily holding fractional frequency division number N data input from control circuit 107 (see FIG. 14) and transmitting the fractional frequency division number N data to adder 112 from Q terminal on the rising edge of a clock signal. Furthermore, accumulator 111 includes first flip-flop 114 for temporarily holding cumulative addition value data input from first adder 112 and transmitting the cumulative addition value data to first adder 112 from Q terminal on the rising edge of the clock signal. When a result of addition of input data from first flip-flop 113 and second flip-flop 114 in first adder 112 is an overflow, "1" as overflow data is transmitted to a second adder (not shown) constituting second frequency divider 106 (see, FIG. 14). That is to say, only when accumulator 111 in FIG. 15 outputs overflow data, a frequency division ratio of variable frequency divider 15 (see FIG. 14) is M+1, and at other time, the frequency division ratio is M.

In a conventional general synthesizer having such a configuration, when a frequency division ratio is changed, once second frequency divider 106 is reset, and then a desired frequency division ratio is selected. That is to say, as shown in FIG. 15, when reset section 115 is connected to D terminal of second flip-flop 114 and frequency division ratio is changed, firstly, a reset signal is input into R terminal of reset section 115. Thus, data stored in accumulator 111 are returned to preset data. This is because past data are stored in accumulator 111, unless such data are reset, switching to a desired frequency division ratio may be delayed. For example, when the fractional frequency division number is $2^{19}$ and an operation frequency of the accumulator is 5 MHz, when the frequency division ratio is changed without carrying out reset (in a state in which the past cumulative addition value is kept), switching delay of 0.1 seconds at maximum may occur. Thus, the initial value of accumulator 111 is required to be reset to a preset value.

FIG. 16 is a timing chart showing an operation of second frequency divider 106 (see FIG. 14). For easy description, the timing chart of FIG. 16 shows an example in which a 3-bit binary accumulator is used. When fractional frequency division number N is 3, at the third rising of clock signal a, cumulative addition value b reaches 9, that is, is beyond "8" as the maximum value of 3-bit binary, so that a carry occurs. Then, "1" as overflow data c is transmitted and frequency division ratio d becomes "M+1." At this time, "1" as remaining data after the carry is input into first flip-flop 113 (see FIG. 15). Herein, when fractional frequency division number N input from control circuit 107 is changed from "3" to the other value, in a conventional accumulator 111 shown in FIG. 15, a reset signal is input into reset section 115 and the cumulative addition value to be input into second flip-flop 114 is returned to 0. Thus, reset is carried out.

In general, conventional synthesizers are often used in channel switching of portable telephones. However, when conventional synthesizer 100 is used for receivers of digital television, and the like, at every timing second frequency divider 106 is controlled corresponding to temperature change, second frequency divider 106 may be reset. At this moment, the oscillating frequency of oscillator 105 (the output frequency of a synthesizer) is changed largely. As a result, a phase noise that is a ratio of electric power of the oscillating frequency to a noise in the vicinity thereof may be large. Since the oscillating frequency is generally used for a local signal and the like, deterioration of phase noise performance of the local signal may cause considerable deterioration of a C/N (Carrier/Noise) property of a received signal. Herein, the C/N means a ratio of a received signal to a noise. Reduction of the C/N may cause an increase in BER (Bit Error Rate) at the demodulation side, thus deteriorating the reception state. In televisions, for example, the deterioration of the C/N makes the reception state bad or makes the reception itself impossible.

Patent document 1: Japanese Patent Unexamined Publication No. H3-209917

SUMMARY OF THE INVENTION

The present invention provides a synthesizer in which deterioration of phase noise is reduced when a frequency division ratio of a frequency divider is switched.

The synthesizer of the present invention includes a comparator for receiving an input of a reference oscillation signal output from a reference oscillator; an oscillator for outputting an oscillation signal based on an output signal from the comparator; and a frequency divider for dividing a frequency of an output signal from the oscillator based on control by a controller. The synthesizer further includes a frequency error detector for detecting an frequency difference between a preset frequency and a frequency based on the reference oscillation signal. Furthermore, the comparator compares an output signal from the frequency divider with an output signal from the reference oscillator, and outputs a signal showing a comparison result to the oscillator. Furthermore, the controller changes a frequency division ratio of the frequency divider based on an output signal from the frequency error detector in a state in which a part of the frequency division ratio is kept at the past value.

According to such a configuration, the synthesizer of the present invention changes the frequency division ratio without resetting the frequency divider (in a state in which the past cumulative addition value is kept) when the frequency division ratio of the frequency divider is changed according to the temperature change. Therefore, it is possible to suppress the change in the output frequency of the synthesizer when the frequency division ratio is changed, to prevent the phase noise from being deteriorated, and to prevent the C/N property as an index of the reception performance from being deteriorated.

BRIEF DESCRIPTION OF THE DRAWINGS

FIG. 4A is a timing chart showing another operation of a frequency divider in accordance with the exemplary embodiment.

FIG. 6 is a timing chart showing an operation of a frequency divider using another accumulator in accordance with the exemplary embodiment.

Figure 1:
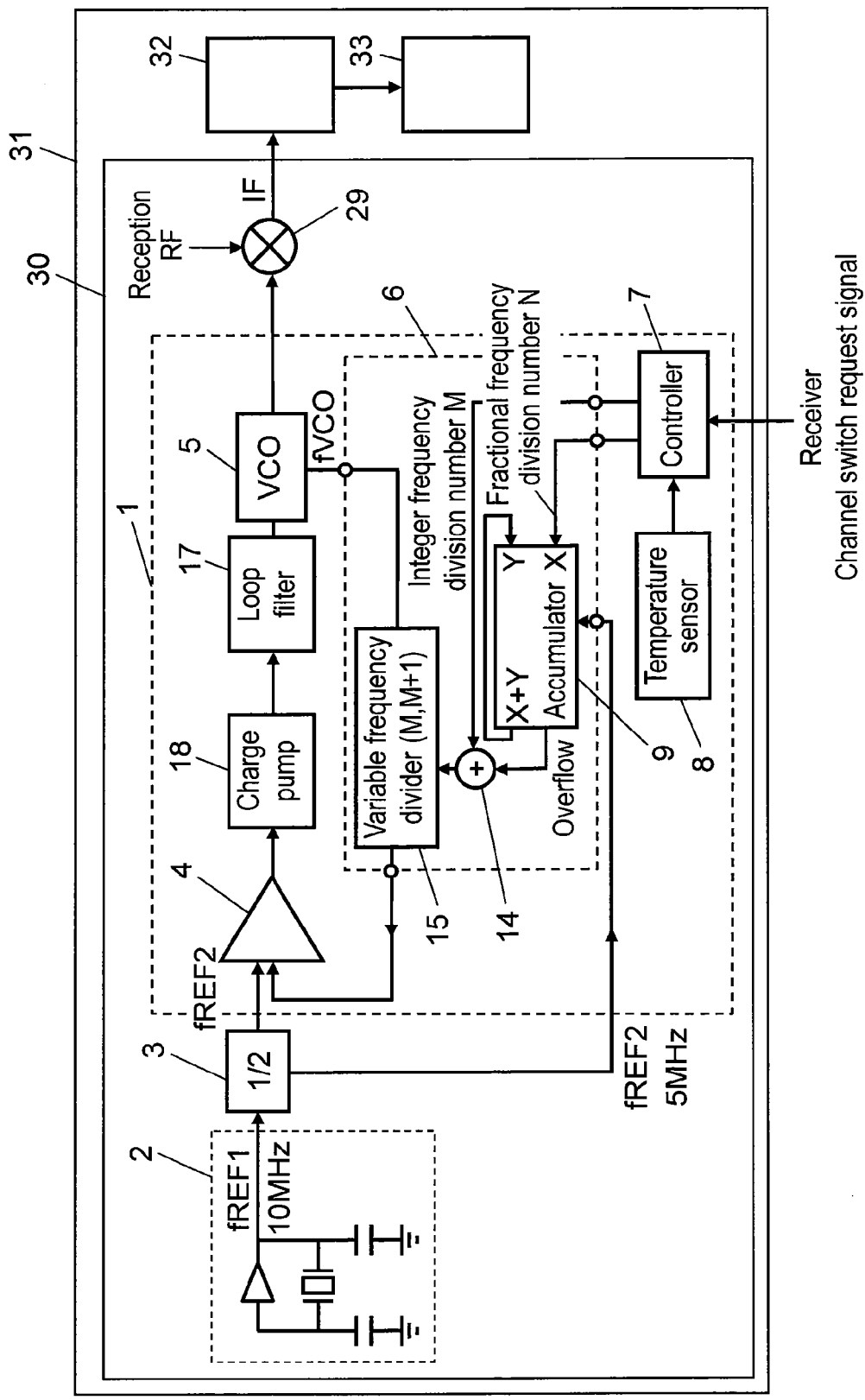
FIG. 1 is a configuration diagram showing an electronic device in accordance with one exemplary embodiment of the present invention.

REFERENCE MARKS IN THE DRAWINGS 1 synthesizer
2 MEMS oscillator
3 first frequency divider
4 comparator
5 oscillator
6 second frequency divider
7 controller
8 temperature sensor
9 accumulator
11 first flip-flop
12 second flip-flop
13 first adder
14 second adder
15 variable frequency divider
17 loop filter
18 charge pump
20 base substrate
21 MEMS resonator
22 module for receiving television
23 antenna
24 first filter
25 LNA
26 second filter
27 balun
28 reset controller
29 mixer
30 reception device 31 electronic device
32 signal processing section
33 display section
34 chip component

DETAILED DESCRIPTION OF THE PREFERRED EMBODIMENT

Exemplary Embodiment

Hereinafter, a synthesizer in accordance with a first exemplary embodiment is described with reference to drawings. FIG. 1 is a configuration diagram showing an electronic device using a synthesizer in accordance with one exemplary embodiment of the present invention.

In FIG. 1, reception device 30 includes synthesizer 1 and oscillator (hereinafter, referred to as "MEMS oscillator") 2 as MEMS (Micro Electro Mechanical Systems) element for outputting a reference oscillation signal. Reference oscillating frequency fREF1 of MEMS oscillator 2 is 10 MHz. Reception device 30 further includes first frequency divider 3 for ½ dividing an output from MEMS oscillator 2, and mixer 29 for converting a frequency of a reception RF (Radio Frequency) signal based on an oscillation signal output from synthesizer 1. Electronic device 31 includes signal processing section 32 connected to the output side of mixer 29 of reception device 30, and display section 33 connected to the output side of signal processing section 32.

Synthesizer 1 includes comparator 4 connected to first frequency divider 3, and voltage control oscillator (hereinafter, referred to as oscillator) 5 connected to comparator 4 via charge pump 18 and loop filter 17. Synthesizer 1 further includes controller 7 for controlling a frequency division number based on a channel switch request signal of a receiver, and second frequency divider 6 for dividing a frequency of oscillation signal (fVCO) output by oscillator 5 based on the frequency division number output from controller 7. Furthermore, synthesizer 1 includes temperature sensor 8 for detecting the ambient temperature and outputting a signal corresponding to the detected temperature to controller 7. Herein, even if an oscillation signal of a preset predetermined frequency from oscillator 5 is intended to be obtained, due to the change in the ambient temperature, a frequency error occurs between the preset frequency and a frequency based on the reference oscillation signal output from MEMS oscillator 2. Temperature sensor 8 has a function of detecting this error. That is to say, temperature sensor 8 has a function as a frequency error detection section for detecting an error between the preset frequency and the frequency based on the reference oscillation signal.

Second frequency divider 6 includes accumulator 9 for receiving an input of fractional frequency division number N output from controller 7, and second adder 14 for adding the output from accumulator 9 and integer frequency division number M output from controller 7. Second frequency divider 6 further includes variable frequency divider 15 for dividing the frequency of a signal output from oscillator 5 based on an output from second adder 14.

Hereinafter, an operation of the reception device having the above-mentioned configuration in accordance with this exemplary embodiment is described. A reference oscillation signal output from MEMS oscillator 2 is ½ divided by first frequency divider 3, and then input into comparator 4 of synthesizer 1. The output from comparator 4 is converted into an electric component by charge pump 18. Furthermore, the output from charge pump 18 is received by loop filter 17. Loop filter 17 takes out only a component near a direct current and supplies it to oscillator 5. Loop filter 17 includes a charge section for charging an electric current (electric charge) from comparator 4 by a capacitor, and a low-pass filter that allows a low frequency to pass. In this exemplary embodiment, an output from comparator 4 is output to oscillator 5 via charge pump 18 and loop filter 17. However, the output from comparator 4 may be directly connected to oscillator 5 without including other circuits between comparator 4 and oscillator 5. Any configurations may be employed as long as oscillator 5 outputs an oscillation signal based on the output signal from comparator 4 and inputs it into second frequency divider 6.

Second frequency divider 6 divides a frequency of an oscillation signal of oscillator 5 based on a control signal from controller 7 and outputs it to comparator 4. Comparator 4 compares an input signal from second frequency divider 6 with an input signal from the above-mentioned first frequency divider 3, and outputs a signal showing a comparison result to oscillator 5. By repeating the above-mentioned operation, synthesizer 1 operates.

Controller 7 transmits appropriate control signals of integer frequency division number M and fractional frequency division number N based on an output signal of temperature sensor 8 detecting a temperature so as to change a frequency division ratio of second frequency divider 6. That is to say, the frequency division number input into second frequency divider 6 consists of an integer part to which frequency division number M is to be input and a fractional part to which fractional frequency division number N is to be input. When controller 7 changes the frequency division ratio, it changes the frequency division ratio into a desired one without resetting second frequency divider 6. That is to say, controller 7 changes the frequency division ratio into a desired one without returning it to the preset value in a state in which second frequency divider 6 is kept at the past value. Thus, it is possible to achieve a synthesizer in which the phase noise characteristic is less deteriorated when the frequency division ratio of second frequency divider 6 is switched. At the same time, the C/N performance of a receiver can be secured, and thus a receiver whose receiving property is not deteriorated can be achieved. Oscillator 5 described herein is a VCO (Voltage Control Oscillator) that sweeps a frequency by a DC voltage.

A synthesizer module in accordance with this exemplary embodiment includes synthesizer 1, MEMS oscillator 2 formed of a resonator including an MEMS element. An output signal from MEMS oscillator 2 is input into comparator 4 via first frequency divider 3.

Figure 2:
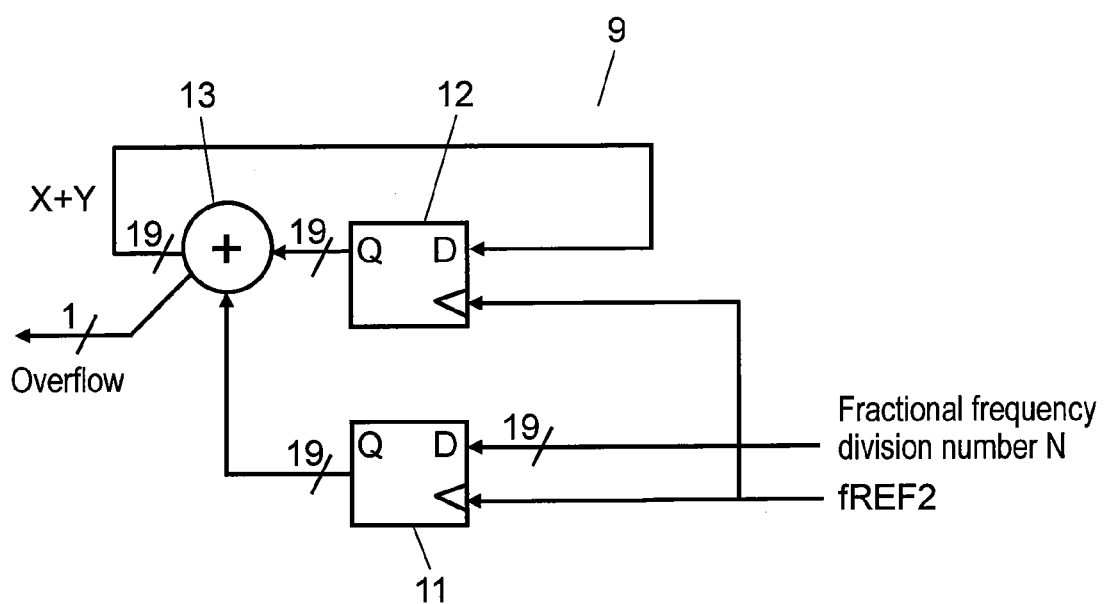
FIG. 2 is a configuration diagram showing an accumulator in accordance with the exemplary embodiment.

Next, accumulator 9 constituting second frequency divider 6 shown in FIG. 1 is described. FIG. 2 is a configuration diagram showing accumulator 9 in accordance with this exemplary embodiment. FIG. 2 shows a 19-bit binary accumulator as an example. In FIG. 2, accumulator 9 includes first flip-flop 11 for temporality holding fractional frequency division number N data input from controller 7 (see FIG. 1) and transmitting the fractional frequency division number N data to first adder 13 from Q terminal on the rising edge of a clock signal (fREF: 5 MHz). Furthermore, accumulator 9 includes second flip-flop 12 for temporality holding cumulative addition value data input from first adder 13 and transmitting the cumulative addition value data to first adder 13 from Q terminal on the rising edge of a clock (fREF: 5 MHz). In first adder 13, when the result of addition of data input from first flip-flop 11 and second flip-flop 12 is not less than a value expressed by 19-bit binary, "1" as a value representing overflow data is transmitted to second adder 14 (see FIG. 1). Note here that FIG. 2 shows 1-bit flip-flops 11 and 12. However, actually, 19 bits are needed, and 19 pairs of flip-flops 11 and 12 are needed. Furthermore, adder 13 is also a 19-bit adder.

In FIG. 1, second adder 14 adds overflow data value "1" and integer frequency division number M and inputs the addition result "M+1" into variable frequency divider 15. That is to say, only when accumulator 9 shown in FIG. 2 outputs overflow data, the frequency division ratio of variable frequency divider 15 becomes "M+1," and frequency division ratio at the other time becomes M.

Therefore, the frequency division ratio of second frequency divider 6 is represented by the following mathematical formula Math. 1.

$$\text{Frequency dividing ratio} = \left(M + \frac{N}{2^{19}}\right) \quad \text{[Math. 1]}$$

Furthermore, the oscillating frequency of oscillator 5 at this time is denoted by the following mathematical formula Math. 2.

$$\text{Oscillating Frequency} = \left(M + \frac{N}{2^{19}}\right) \times fREF2 \quad \text{[Math. 2]}$$

Note here that in the frequency division ratio represented by mathematical formula Math. 1, the first item shows the integer frequency division ratio and the second item shows the fractional frequency division ratio.

Furthermore, this exemplary embodiment schematically shows a configuration in which overflow data and integer frequency division number M are added in second adder 14, and then the result is input into variable frequency divider 15. However, second adder 14 may not necessarily be provided. The equal operation can be carried out by a variable frequency divider in which overflow data and integer frequency division number M are individually input and different frequency dividing operations of M or M+1 can be carried out.

As mentioned above, in accumulator 9 in this exemplary embodiment, when fractional frequency division number N input from controller 7 is changed into another value, unlike a conventional case, a reset signal is not input and a cumulative addition value to be input into second flip-flop 12 is not returned to "0." This is described with reference to a timing chart showing an operation of the second frequency divider.

Firstly, an operation of controlling second frequency divider 6 by controller 7 when synthesizer 1 shown in FIG. 1 receives a channel switch request signal and changes a channel is described.

Figure 3:
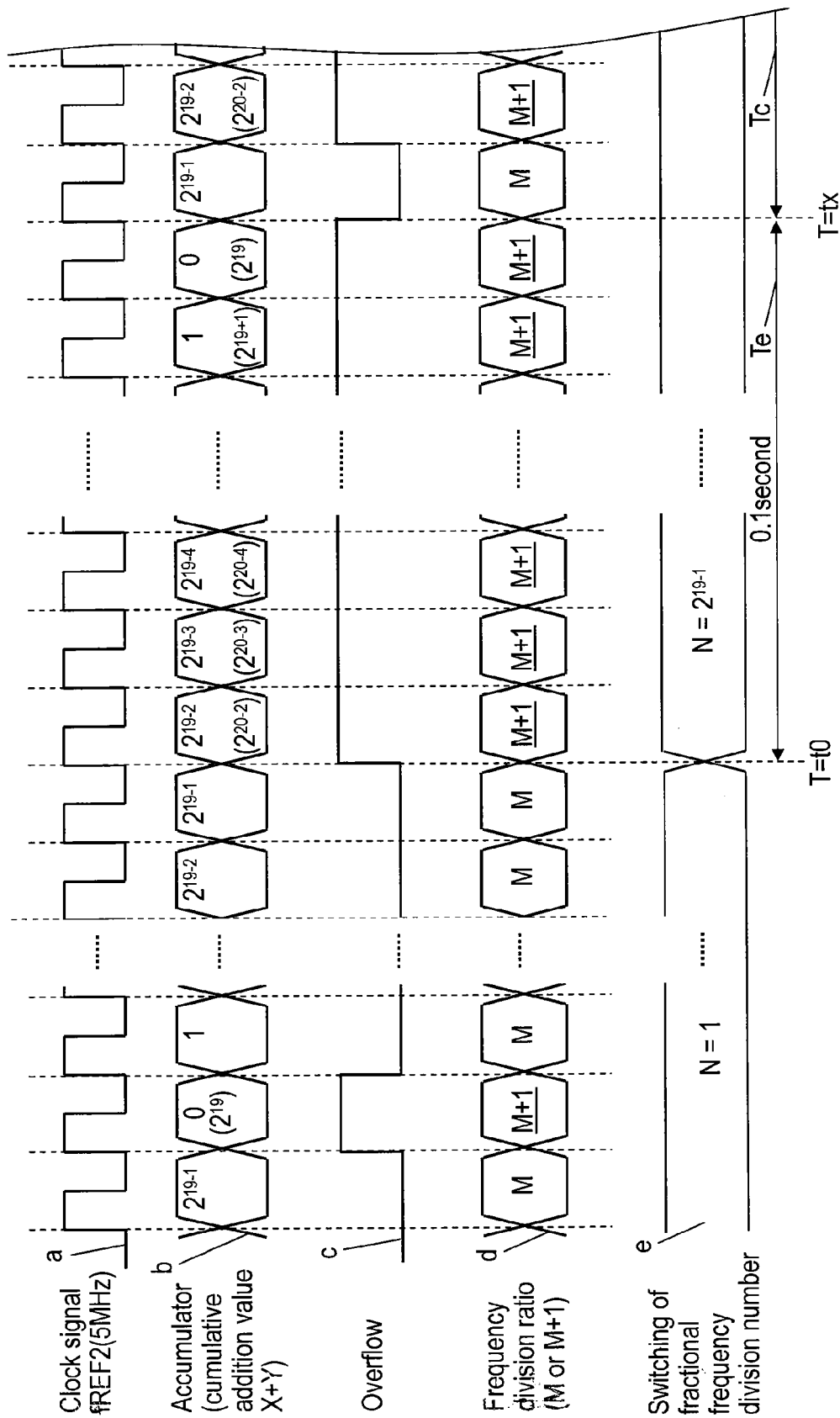
FIG. 3 is a timing chart showing an operation of a frequency divider in accordance with the exemplary embodiment.

FIG. 3 is a timing chart showing an operation of second frequency divider 6 in accordance with this exemplary embodiment. FIG. 3 shows a case in which a 19-bit binary accumulator is used. In FIG. 3, on the rising edge of clock signal (fREF2) a, cumulative addition value b of accumulator 9 is sequentially added. When a channel switch request signal is input at time T=t0, fractional frequency division number switch signal e becomes "H" at time T=t0. During the term until time T=t0 when cumulative addition value b of accumulator 9 becomes $2^{19-1}$, fractional frequency division number N=1 is input. Later than the time, fractional frequency division number N=$2^{19-1}$ is input. In this case, unlike a conventional accumulator, since the cumulative addition value is not reset to 0 (i.e., in a state in which the cumulative addition value is not returned to the preset value but the past cumulative addition value is kept), additional fractional frequency division number $2^{19-1}$ is added to cumulative addition value $2^{19-1}$ of accumulator 9 at time T=t0. Therefore, at this time, overflow data c outputs "1," and frequency division ratio d is changed from M to M+1 at this time.

Figure 4B:
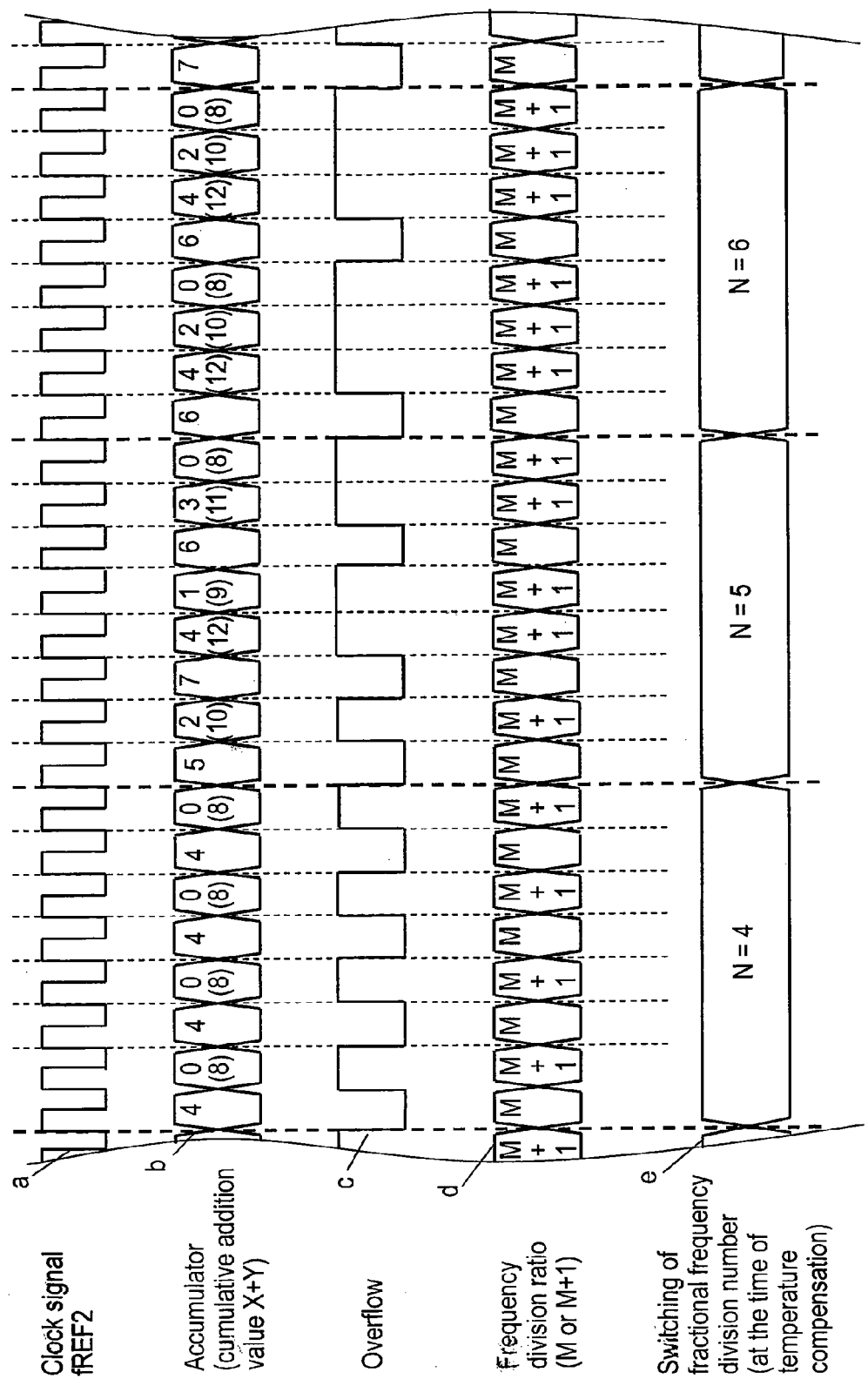
FIG. 4B is a timing chart showing another operation of a frequency divider in accordance with the exemplary embodiment.
Figure 4C:
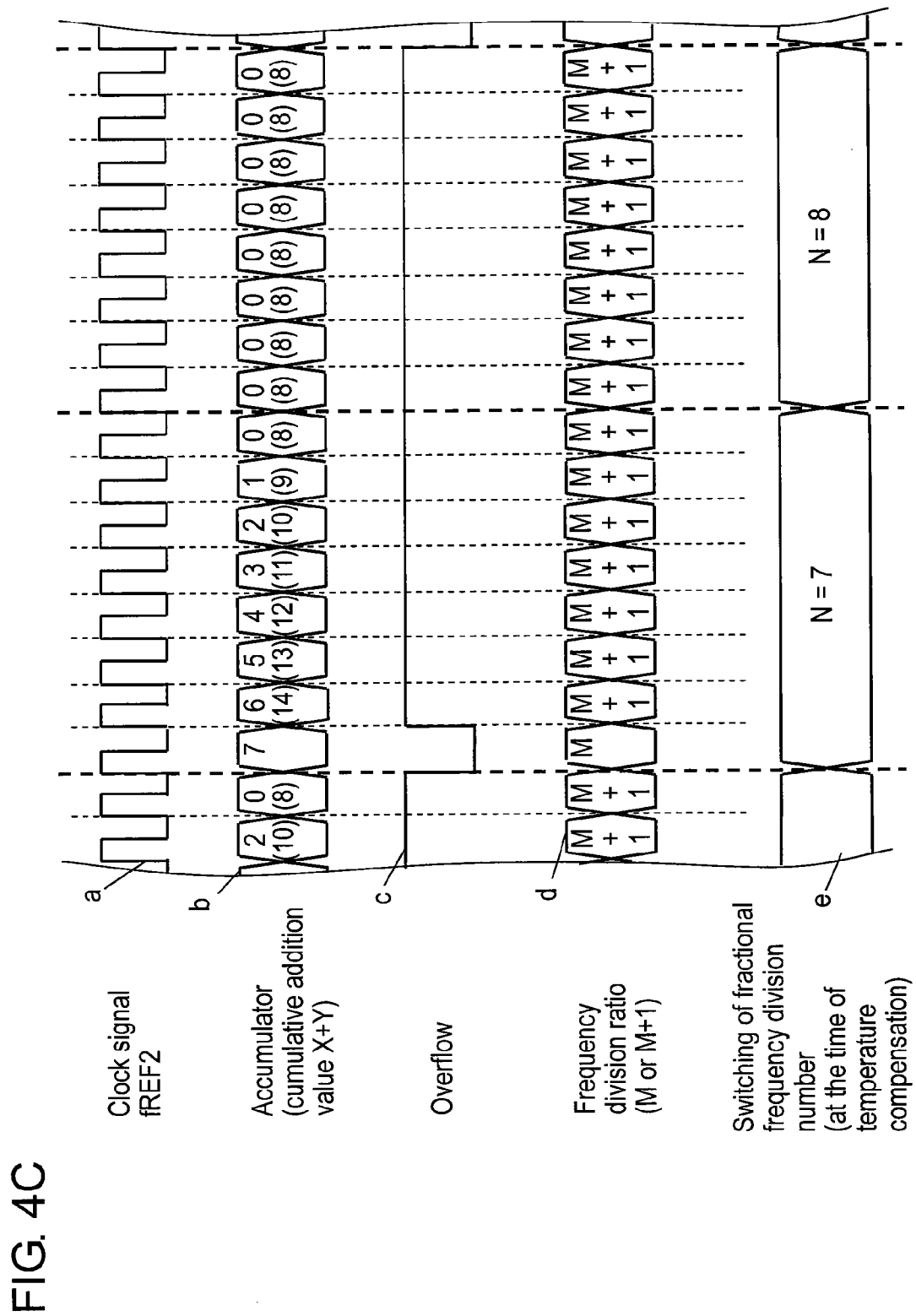
FIG. 4C is a timing chart showing another operation of a frequency divider in accordance with the exemplary embodiment.

Next, an operation is described in which controller 7 controls second frequency divider 6 based on an output signal from temperature sensor 8 shown in FIG. 1. A temperature change of MEMS oscillator 2 as a reference oscillator, which is one of the factors changing the frequency division ratio of a synthesizer, is continuous unlike the case of channel change of a receiver. Furthermore, the amount of change of the frequency division ratio according to the temperature change of a reference oscillator is small as compared with the channel change. FIG. 4 is a timing chart showing an operation of a second frequency divider of this exemplary embodiment based on an output signal from temperature sensor 8.

A temperature is an analog quantity and it does not have such a large change as in a channel switch request signal. Therefore, controller 7 in FIG. 1 gradually outputs a signal that changes fractional frequency division number N. FIG. 4 is a timing chart when fractional frequency division number N is changed finely based on an output from temperature sensor 8. FIG. 4 shows an example in which 3-bit accumulator 9 is simply used. When value N of fractional frequency division number switch signal e is finely increased one by one from "1" to "8," the occurrence of values (M, M+1) of frequency division ratio d changes as shown in overflow data c of the output of the accumulator. Accordingly, frequency division ratio d is gradually shifted from M to M+1. Similarly, according to the shift of frequency division ratio d, the output frequency of a local oscillator changes. FIG. 3 shows an example in which integer frequency division number M is not changed and fractional frequency division number N is considerably switched from "1" to "$2^{19-1}$," so that the oscillating frequency output from oscillator 5 is largely changed. However, the same is true for the case of the channel change in which integer frequency division number M is changed.

Herein, a change in the frequency division ratio at the time of channel change and a change in the frequency division ratio at the time of temperature compensation are described specifically, Firstly, the change in the frequency division ratio by temperature compensation is described. This specific example uses a silicon resonator whose frequency change with respect to temperatures is larger than that of quartz-crystal resonators. For example, a silicon resonator having the primary frequency temperature coefficient of 30 ppm/° C. is used. Furthermore, a case in which a silicon resonator and MEMS oscillator 2 as a reference oscillator including a driver circuit for driving the silicon resonator are used is described. Furthermore, in one-segment broadcast, a case is assumed that channels to be used are 13 channels (center frequency: 473.143 MHz), the reference oscillating frequency is 10 MHz, and a temperature is changed by −3.3° C. at one moment.

Comparison frequency (fREF2) of clock signal a that is output from first frequency divider 3 carrying out ½ frequency division shown in FIG. 1 is 5 MHz (10 MHz/2) before temperature change. Furthermore, the frequency output from oscillator 5 is 473.643 MHz obtained by adding the intermediate frequency of 0.5 MHz to 473.143 MHz. Therefore, total frequency division number K of second frequency divider 6 is 473.643 MHz/5 MHz=94.7286. That is to say, integer frequency division number M is 94, the fractional frequency division ratio is 0.7286, and fractional frequency division number N as the numerator of the above-mentioned fractional frequency division ratio is N=3 81996 (which is derived from equation: $N/2^{19}$=0.7286). Herein, fractions are omitted.

Next, a case in which a temperature changes by −3.3° C. is described. In this case, the reference frequency is 30 ppm/° C.×3.3° C.=100 ppm with change rate margin of 1 KHz. In other words, the reference oscillating frequency changes from 10 MHz to 10.001 MHz. Furthermore, comparison frequency FREF2 is 10.001/2=5.0005 MHz. Therefore, when the intermediate frequency is intended to be kept at 473.643 MHz, which is a frequency before temperature change, it is necessary that total frequency division number K of second frequency divider 6 is 473.643 MHz/5.0005 MHz=94.719128.

In other words, integer frequency division number M=94 is the same value as that before the temperature change, and fractional frequency division ratio is required to be changed to 0.719128. That is to say, fractional frequency division number N is required to be changed to 377030 (which is derived from an equation: $N/2^{19}$=0.719128). Herein, fractions are omitted.

Herein, the difference in fractional frequency division number N that is changed for correcting the change in the frequency is 381996−377030=4966. This value is a little less than 1% as compared with the maximum change value of fractional frequency division number N that is $2^{19-1}$.

Next, the change of the frequency division ratio at the time of channel change is described. When the channels to be used are changed to 15 channels, the center frequency is made to be 485.143 MHz. If the reference oscillating frequency under the above-mentioned condition in which a temperature does not change, the frequency to be output from oscillator 5 is 485.643 MHz obtained by adding the intermediate frequency 0.5 MHz to the center frequency. Therefore, total frequency division number K of second frequency divider 6 is 485.643 MHz/5 MHz=97.1286. That is to say, integer frequency division number M is 97, the fractional frequency division ratio is 0.1286, and fractional frequency division number N that is the numerator part of the above-mentioned fractional frequency division ratio is 67423 (which is derived from an equation: $N/2^{19}$=0.1286).

The difference with respect to 13 channels in fractional frequency division number N is 381996−67423=314573. This value is about 60% as compared with $2^{19-1}$ that is the maximum change value of fractional frequency division number N. Furthermore, the difference with respect to 13 channels of integer frequency division number M is 97−95=2. As mentioned above, when the time of temperature compensation is compared with the time of channel change, the change amount of the frequency division ratio is small at the time of temperature compensation according to the temperature change of the local oscillator.

Therefore, in the temperature compensation of oscillator 5 in which the change amount of fractional frequency division number N is finely set, fractional frequency division number N may be controlled continuously without resetting the cumulative addition value of accumulator 9 to 0 (i.e., in a state in which the past cumulative addition value is kept). Thus, it is possible to reduce the change in an output frequency of MEMS oscillator 2 at the time when the frequency division ratio is changed. In other words, the control operation is different from the considerable change in the frequency division ratio at the time of channel change.

As mentioned above, in this exemplary embodiment, when controller 7 controls second frequency divider 6 based on the output from temperature sensor 8, integer frequency division number M output from controller 7 is not changed with respect to the past value. That is to say, when only fractional frequency division number N is changed with respect to the past value, fractional frequency division number N is added without returning the cumulative addition value of accumulator 9 to the preset value. Thus, it is possible to suppress the phase noise, which has occurred conventionally, according to the reset of accumulator 9. Therefore, this exemplary embodiment is extremely effective for synthesizers used under conditions in which the temperature is changed severely.

In FIG. 1, when controller 7 controls second frequency divider 6 based on the output from temperature sensor 8, when the value of integer frequency division number M output from controller 7 is changed to a larger value from the past value, addition of the changed fractional frequency division number N may be carried out after the cumulative addition value of accumulator 9 is reset to the minimum value "0." This makes it possible to reduce the deterioration of the phase noise performance of synthesizer 1 when the frequency division ratio is changed. Specifically, when frequency division ratio is changed from "8.999" to "9.001" by the temperature change in the reference oscillator, integer frequency division number M is changed from "8" to "9" and the fractional frequency division ratio is changed from "0.999" to "0.001." In this case, the fractional frequency division ratio is largely changed from "0.999" to "0.000." However, in synthesizer 1 of this exemplary embodiment, the cumulative addition value stored in accumulator 9 is not reset when the frequency division ratio is changed (in a state in which the past cumulative addition value is kept). Therefore, at the moment when the frequency division ratio is changed, the frequency division ratio approximates to "9.999." Therefore, when integer frequency division number M is changed into a large value with respect to the past value, by resetting a cumulative addition value of the accumulator to the minimum value "0," the frequency division ratio is made to "9.000" once. The change of the frequency division ratio can be made to be smooth, thus enabling the deterioration of the phase noise performance of a synthesizer to be suppressed.

Similarly, in FIG. 1, when second frequency divider 6 is controlled via controller 7 based on an output from temperature sensor 8, in a case in which integer frequency division number M output from controller 7 is changed to a smaller value than the past value, addition of the changed fractional frequency division number N may be carried out after the cumulative addition value of accumulator 9 is reset to the maximum value (for example, the maximum value is $2^{19-1}$ when a 19-bit binary accumulator is used). Also in this case, similar to the above, the change in the frequency division ratio can be made to be smooth, thus enabling the deterioration of the phase noise performance of synthesizers to be suppressed.

When a reception channel is changed in reception device 30 using synthesizer 1 in accordance with this exemplary embodiment, controller 7 controls second frequency divider 6 by changing both integer frequency division number M and fractional frequency division number N. Furthermore, at this time, when controller 7 controls second frequency divider 6 based on a temperature sensed by temperature sensor 8, controller 7 may control second frequency divider 6 by changing only fractional frequency division number N. Thus, when controller 7 controls second frequency divider 6 based on a temperature sensed by temperature sensor 8, it is not necessary to change integer frequency division number M.

Furthermore, only when reception device 30 using synthesizer 1 in accordance with this exemplary embodiment changes the reception channel, second frequency divider 6 may be reset as conventionally. That is to say, as shown in FIG. 3, when accumulator 9 is not reset (in a state in which the past cumulative addition value is kept), during term Te ($2^{19-1}$ clock part) until time T=tx when a state of cumulative addition value is 0 occurs, which is the same as the state in which reset is carried out, is a term in which a desired frequency division ratio is not achieved. The other term Tc is a term in which the frequency division ratio is correct. When comparison frequency fREF of clock frequency a is 5 MHz, a desired frequency division ratio cannot be achieved until $1/5$ (MHz)× $2^{19-1}$=about 0.1 seconds have passed since fractional frequency division number N was changed. In Digital Television Broadcasting in Japan, since a symbol time of OFDM (Orthogonal Frequency Division Multiplexing) is about 1 ms, 100 symbols of data are affected. Therefore, only when a reception channel is changed, accumulator 9 may be reset.

Figure 5:
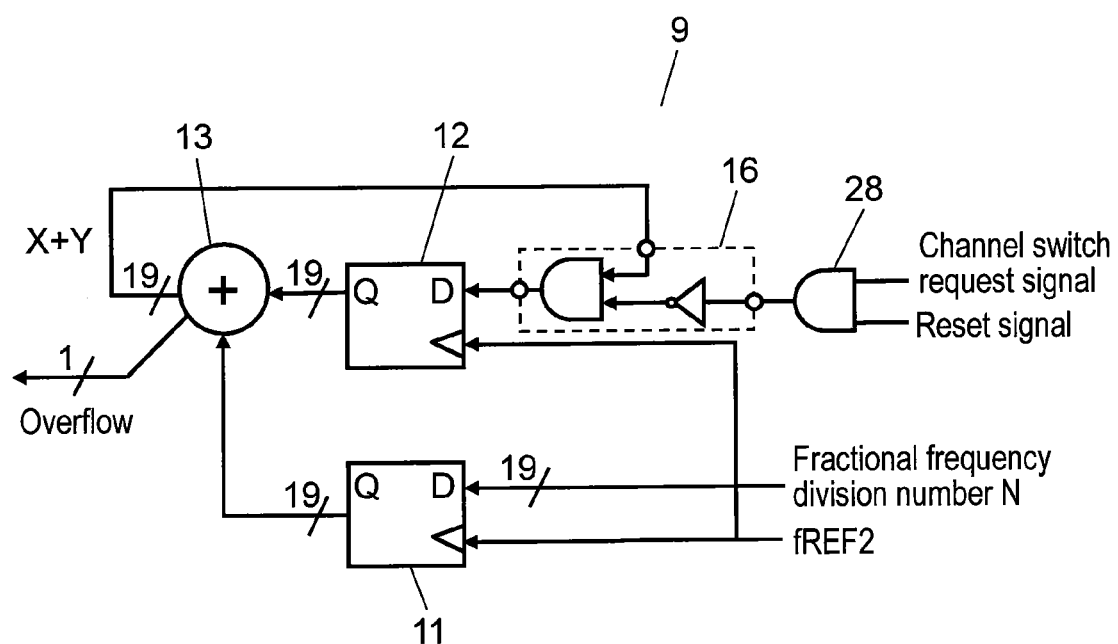
FIG. 5 is a configuration diagram showing another accumulator in accordance with the exemplary embodiment.

FIG. 5 is a configuration diagram showing accumulator 9 that is reset only at the time when a reception channel is changed. Accumulator 9 in shown in FIG. 5 is different from accumulator 9 shown in FIG. 2 in that accumulator 9 shown in FIG. 5 has reset controller 28. Reset controller 28 carries out reset only at the time of channel change request operation. In FIG. 5, channel switch request signal is set to be "H" only at the time of channel change request operation, and a reset signal is set to be "H" only when reset is started. Therefore, even if a reset signal is started in accordance with the change in the frequency division ratio, only at the time of channel switch request operation, second flip-flop 12 is reset and the cumulative addition value is returned to 0. Furthermore, at the time of temperature compensation operation that is not the channel switch request operation, even if the frequency division ratio is changed, second flip-flop 12 is not reset and cumulative addition is continued.

An operation of a frequency divider is described with reference to a timing chart shown in FIG. 6, in which a reset signal is input and a cumulative addition value is reset to 0 when fractional frequency division number N is changed in this way. FIG. 6 shows a case in which, similar to FIG. 3, 19-bit binary accumulator 9 is used. Until time T=t10 when cumulative addition value b of accumulator 9 becomes $2^{19-1}$, fractional frequency division number N=1 is input, and at the time T=t1, the fractional frequency division number is changed to N=$2^{19-1}$. In this case, during time T=t1–t2, the channel switch request signal and reset signal f are input into reset controller 28 of FIG. 5, and cumulative addition value is reset to 0. Consequently, after time T=t2 when fractional frequency division number N is changed, a desired frequency division ratio can be achieved immediately. FIG. 6 shows an example in which integer frequency division number M is not changed and only fractional frequency division number N is considerably changed from 1 to $2^{19-1}$, so that the oscillating frequency output from oscillator 5 is largely changed. However, the same is true for the case in which integer frequency division number M is changed.

In this way, by determining whether second frequency divider 6 is reset or not depending upon the factors of the change in the frequency division ratio, speedup of the channel switch request operation and improvement of phase noise in the temperature compensation operation can be achieved, and thus, total performance of a reception device can be improved.

As described above, in synthesizer 1 in accordance with this exemplary embodiment, when the change of the oscillating frequency according to the temperature change of MEMS oscillator 2 that is the reference oscillator shown in FIG. 1 is controlled based on the output signal of temperature sensor 8 of MEMS oscillator 2, second frequency divider 6 is not reset (in a state in which the past cumulative addition value is kept). In general, a temperature change of a reference oscillator, which is one of the factors for changing the frequency division ratio of a synthesizer, is continuous unlike the case of the channel change of a receiver. Furthermore, the amount of change of the frequency division ratio according to temperature change of a reference oscillator is small as compared with the time of channel change. Therefore, as in this exemplary embodiment, when the frequency division ratio is changed according to the temperature change in MEMS oscillator 2, second frequency divider 6 is not reset (in a state in which the past cumulative addition value is kept), thereby enabling the generation of phase noise to be suppressed.

Figure 7A:
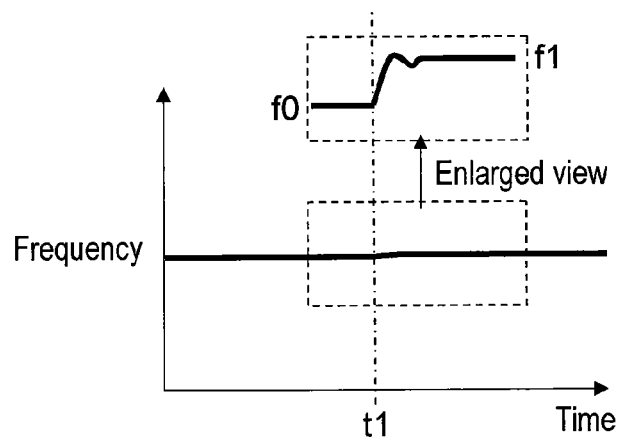
FIG. 7A is a graph showing a change in the oscillating frequency when the frequency division ratio is changed in accordance with the exemplary embodiment.
Figure 7B:
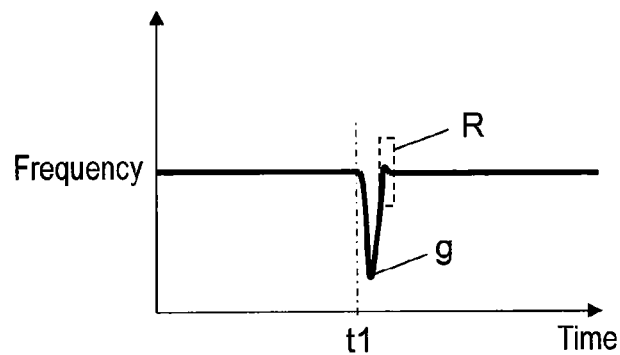
FIG. 7B is a graph showing a change in the oscillating frequency when the frequency division ratio is changed in a conventional synthesizer.
Figure 7C:
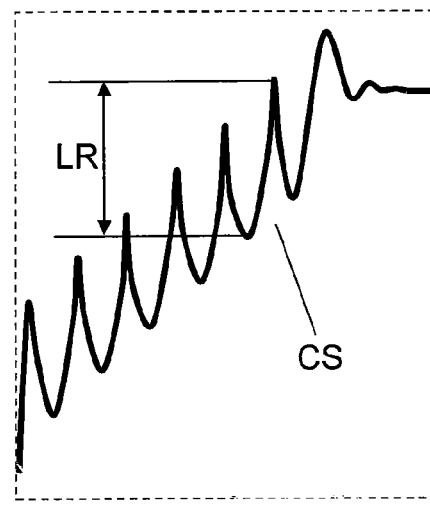
FIG. 7C is an enlarged view showing a principal part of FIG. 7B.
Figure 8A:
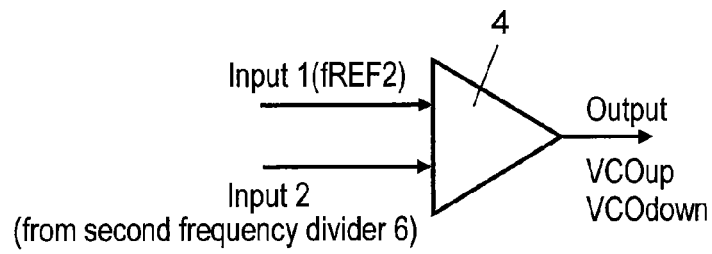
FIG. 8A is a block diagram of comparator 4 in accordance with one exemplary embodiment of the present invention.
Figure 8B:
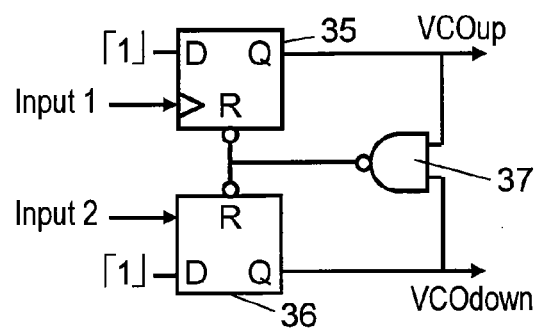
FIG. 8B is an internal circuit diagram of comparator 4.
Figure 8C:
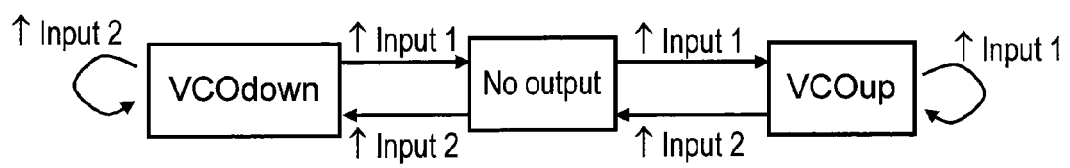
FIG. 8C is a diagram showing a state transition of an output state of comparator 4.
Figure 8D:
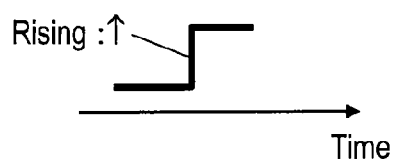
FIG. 8D is a view to illustrate a rising of a waveform of comparator 4.

FIGS. 7A and 7B are graphs showing how the oscillating frequency of oscillator 5 changes over time when the frequency division ratio of second frequency divider 6 is changed. FIG. 7A shows the change over time in the oscillating frequency of synthesizer 1 in accordance with this exemplary embodiment. FIG. 7B shows the change over time in the oscillating frequency of a conventional synthesizer. FIG. 7C is an enlarged view showing R part of FIG. 7B. FIGS. 8A to 8D are diagrams to illustrate comparator 4, FIG. 8A is a block diagram of comparator 4. FIG. 8B is an internal circuit diagram of comparator 4. FIG. 8C is a diagram showing the transition of an output state of comparator 4. FIG. 8D is a view to illustrate the rising of a waveform of comparator 4.

FIGS. 7A and 7B show that the frequency division ratio of second frequency divider 6 is changed at time t1. In FIG. 7B, later than t1, large change g in the frequency is observed. This is caused because the second frequency divider is reset once. On the contrary, in FIG. 7A, later than t1, a large change in a frequency is not observed. This is because second frequency divider 6 is not reset (in a state in which the past cumulative addition value is kept), so that the frequency division ratio is smoothly changed. Thus, in the synthesizer of this exemplary embodiment, the phase noise characteristic can be prevented from being considerably deteriorated when the frequency division ratio is changed. Furthermore, when the synthesizer is used as a receiver, C/N as an index of the reception performance can be prevented from being deteriorated.

Furthermore, when a reset operation is carried out and a frequency is changed largely, a synthesizer carries out cycle slip operation CS as shown in FIG. 7C while it approaches the target frequency. FIG. 7C shows a state immediately before entering a locked state. The locked state means a state in which the phase and frequency of input 1 and input 2 in FIG. 8A coincide with each other. Synthesizers in such a state are referred to as being locked.

Next, an operation of comparator 4 is described with reference to FIGS. 8A to 8D. In FIG. 8A, comparator 4, which is also referred to as a phase frequency comparator, has a function of comparing the frequency and phase of input signals. In FIGS. 8A and 8B, input 1 (fREF2, an output from first frequency divider 3) is entered into D flip-flop 35, and input 2 (an output from second frequency divider 6) is entered into D flip-flop 36. NAND circuit 37 supplies D flip-flops 35 and 36 with a reset signal. To D terminals of D flip-flop 35 and D flip-flop 36, "1" is always input.

Firstly, when comparator 4 is in a state of "no output" in FIG. 8C, outputs of VCOup and VCOdown are in a state of "Low" in FIG. 8B. In this state, when input 1 is first entered into D flip-flop 35 and when a rising edge as shown in FIG. 8D is detected, the output from D flip-flop 35, i.e., "VCOup," becomes "High." That is to say, a state moves to "VCOup" state in FIG. 8C. When input 2 is entered into D flip-flop 36 in this "VCOup" state and a rising edge shown in FIG. 8D is detected, the output of D flip-flop 36, i.e., "VCO-down," becomes "High." That is to say, a state moves to a state of "no output" in FIG. 8C. This circuit operation is described with reference to FIG. 8B. Outputs of both VCOup and VCOdown become "High" and an output of NAND circuit 36 becomes "Low." Therefore, two D flips are reset, the output thereof becomes "Low," and then a state moves to a "no output" state in FIG. 8C.

The above-described cycle slip operation CS occurs when the phase differences of input 1 and input 2 are 0° or 180°. This is a phenomenon that although two frequencies of signals do not coincide with each other, phases (edges of pulse signals) are determined to coincide with each other at 0° or 180°, and phase delay and phase lead are determined oppositely at a next moment (at next 0° or 180°, the phase delay and phase lead are returned). By repeating such phenomena, the output signal gradually approaches the target value. A frequency range in which cycle slip operation CS occurs is referred to as lock range LR (see FIG. 7C). When a difference between the current frequency and a frequency after switching of the fractional frequency division number falls within lock range LR, the frequencies approximate to each other and an operation for locking the phase is carried out (before that time, frequency lock operation is carried out). In other words, when the next target frequency (frequency division number) is set in this lock range LR, the frequency convergence time is further fastened, and the effect of the present invention can be exhibited more remarkably.

Specifically, it is preferable that the difference, which is described in FIG. 4, between the frequency immediately before switching of the fractional frequency division number (immediately before switching of N) and the frequency after switching falls within this lock range. At this time, as the switching period T1 is shorter, the amount of frequency to be adjusted per time (difference between the frequency immediately before switching and the frequency after switching) can be reduced, thus shortening the convergence time. In synthesizers whose frequency of an output signal is about 500 MHz to 1 GHz, the lock range becomes about 1 to 5 kHz, which is about 1 to 10 ppm with respect to the output signal. That is to say, when the amount of frequency to be adjusted per time is made to be at least not more than 1 ppm with respect to the frequency of the output signal of the synthesizer, the above-mentioned object can be achieved. Note here that detection of a temperature (that is, detection of the frequency change amount due to a temperature), correction timing of frequency, and a period do not necessarily coincide with each other.

Figure 9A:
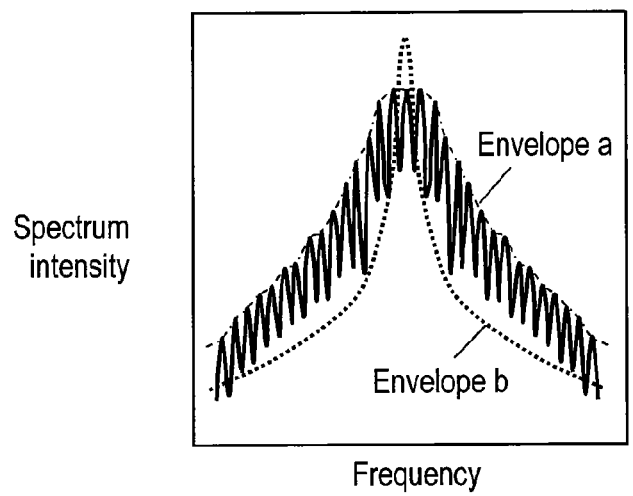
FIG. 9A shows a state of a frequency spectrum immediately before switching of a fractional frequency division number in accordance with the exemplary embodiment.

FIG. 9A shows a state of a frequency spectrum in a case in which a difference between the frequency immediately before switching of the fractional frequency division number (immediately before switching of N) and the frequency after switching is larger than lock range LR (hereinafter, this condition is referred to as "condition 1") as well as a case in which the difference is within the lock range (hereinafter, this condition is referred to as "condition 2"). In FIG. 9A, a solid line shows a spectrum of condition 1, envelope a shown by a dashed-and-dotted line is an envelope linking peak parts of the spectrum in condition 1. Furthermore, envelope b shown by a broken line is an envelope linking peak parts of the spectrum of condition 2. When envelope a is compared with envelope b, the level of the phase noise is larger in envelope a. In other words, in condition 1, the phase noise of an output signal of a synthesizer is large. When the phase noise is bad, C/N is deteriorated, resulting in deterioration of the reception performance.

Figure 9B:
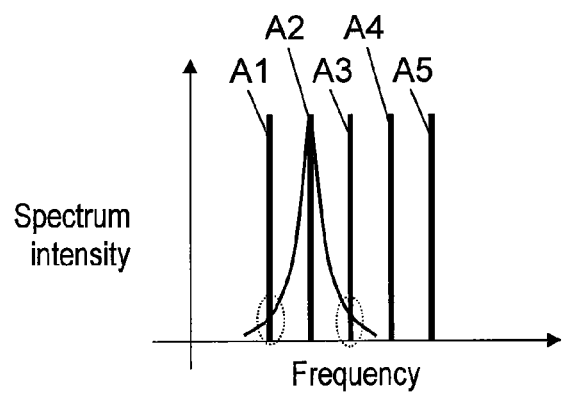
FIG. 9B is a graph schematically showing a spectrum of a predetermined carrier in accordance with the exemplary embodiment.

FIG. 9B schematically shows a spectrum of a multicarrier of OFDM in condition 2, showing five carriers A1 to A5. Herein, an effect of the phase noise of carrier A2 on neighboring carriers A1 and A3 ("noise level" viewed from A1 and A3) is relatively small.

Figure 9C:
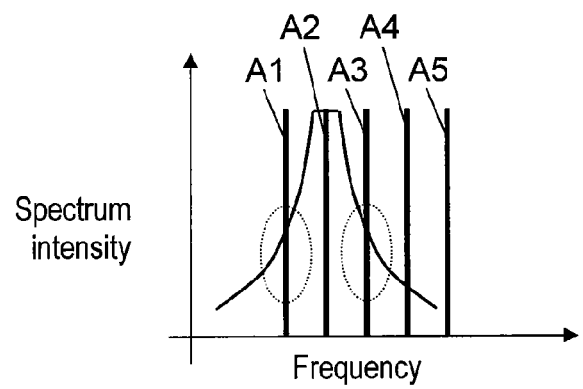
FIG. 9C is a graph schematically showing a spectrum of another predetermined carrier in accordance with the exemplary embodiment.

FIG. 9C schematically shows a spectrum of a multicarrier of OFDM in condition 1, showing five carriers A1 to A5. In FIG. 9C, an effect of the phase noise of carrier A2 on neighboring carriers A1 and A3 is relatively large as compared with condition 2, which causes the deterioration of C/N and the deterioration of the reception performance mentioned above. The above-mentioned observation of spectra shows the significance of the effect obtained by allowing a difference between the frequency immediately before switching of the fractional frequency division number (immediately before switching of N) and the frequency after switching to fall within the lock range.

The "frequency immediately before switching of the fractional frequency division number" in the present invention signifies a frequency of an output signal of a synthesizer immediately before switching to N1 when the fractional frequency division number is switched to N1 at one moment. Furthermore, "frequency after switching of the fractional frequency division number" in the present invention signifies a frequency of an output signal of a synthesizer during the term until the fractional frequency division number is switched to N2 after the fractional frequency division number is switched to N1.

One example thereof is described with reference to FIG. 4. When the fractional frequency division number is switched from N=1 to N=2, the frequency of an output signal of a synthesizer during term TA in a state in which the fractional frequency division number is N=1 corresponds to the "frequency immediately before switching of the fractional frequency division number," and the frequency of an output signal of a synthesizer during term TB in which the fractional frequency division number is N=2 corresponds to the "frequency after switching of the fractional frequency division number."

Figure 10A:
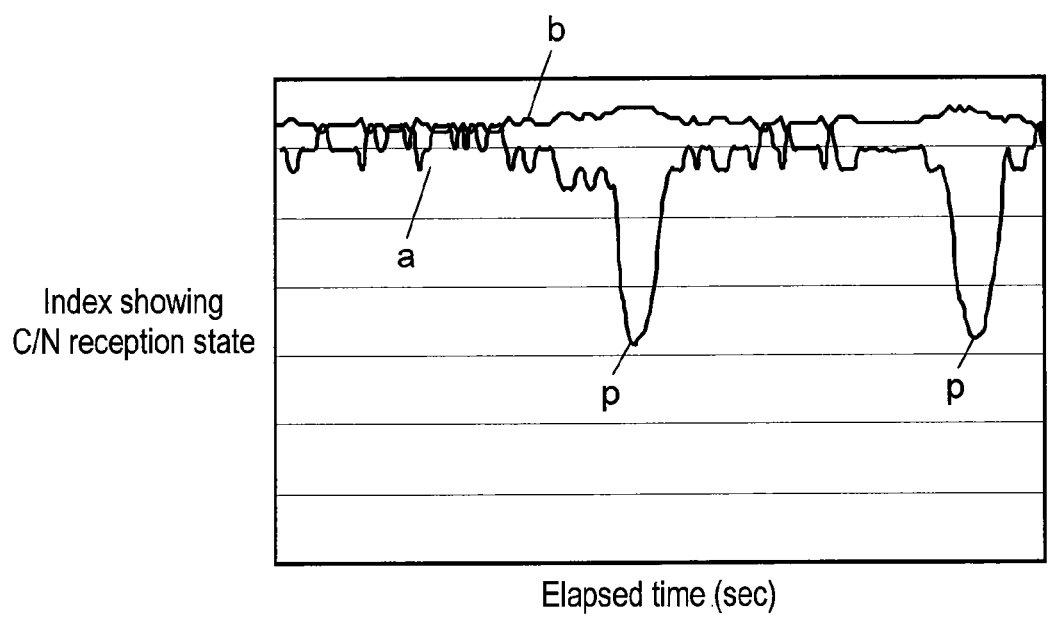
FIG. 10A is a graph showing a comparison between a C/N property of a synthesizer using a quartz-crystal oscillator in accordance with the exemplary embodiment and a C/N property of a conventional synthesizer.
Figure 10B:
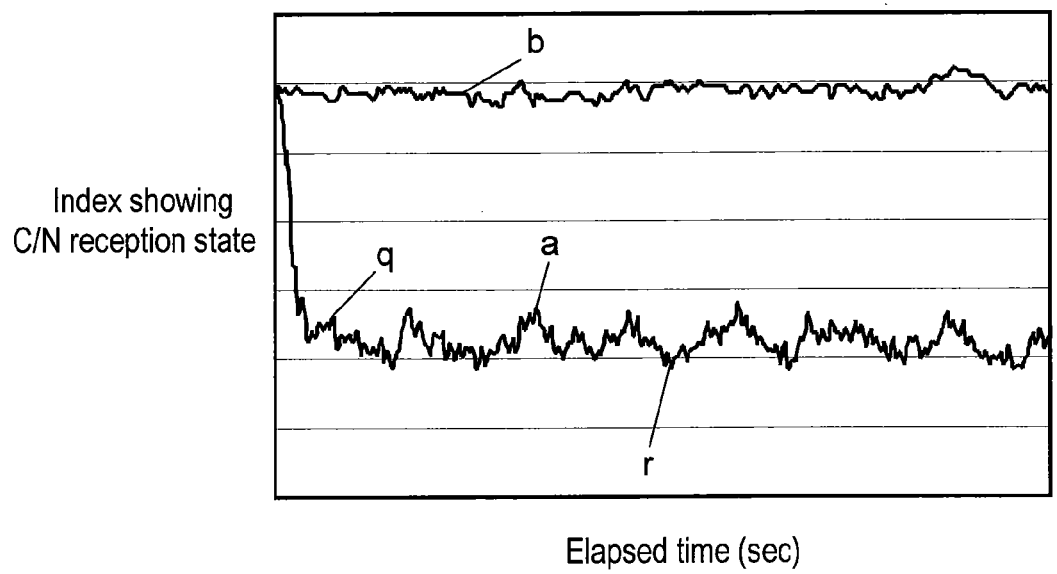
FIG. 10B is a graph showing a comparison between a C/N property of a synthesizer using an MEMS oscillator in accordance with the exemplary embodiment and a C/N property of a conventional synthesizer.

FIGS. 10A and 10B are graphs showing a change of a reception state in One Segment Television Broadcasting when the synthesizer of this exemplary embodiment is used. FIG. 10A is a graph showing a change when a quartz-crystal oscillator is used as a reference oscillator. FIG. 10B is a graph showing a change when an MEMS oscillator including a silicon resonator is used as the reference oscillator. In each graph, solid line a shows a change when accumulator 9 is reset and solid line b shows a change when accumulator 9 is not reset (in a state in which the past cumulative addition value is kept). Solid lines a and b in each graph show difference depending upon whether reset is carried out or not. Herein, as the quartz-crystal oscillators, a TCXO (temperature-compensated crystal oscillator) or a quartz-crystal resonator whose cutting angle is accurately defined is not used at this time. Instead, oscillators that can be obtained at a relatively low cost are used. The frequency-temperature characteristic of this quartz-crystal is ±100 ppm in the temperature range from −30° C. to 85° C. This quartz-crystal is not so expensive but has a relatively excellent temperature characteristic. Therefore, the control interval of second frequency divider 6 based on the results sensed by temperature sensor 8 is longer than the case in which an MEMS oscillator is used.

Firstly, FIG. 10A in which a quartz-crystal oscillator is used is described. In solid line a in which reset is carried out, the C/N as an index showing a reception state is deteriorated at a timing when a temperature correction or reset is carried out as shown in waveform p. The reason why the deterioration of the C/N lasts for a long time although the reset is momentary is because a system has a problem that it takes a long time to adjust the intermediate frequency shifted at the demodulation side. In solid line b in which reset is not carried out (in a state in which the past cumulative addition value is kept), substantially an excellent C/N performance is maintained.

Secondly, FIG. 10B in which an MEMS oscillator is used is described. Herein, as mentioned above, since the frequency-temperature characteristic is as bad as 30 ppm/° C. in the case of a silicon resonator, a correction interval needs to be shortened. In other words, reset interval is short, so that reset frequently occurs. For example, in this exemplary embodiment, the correction interval is made to be 50 msec. In FIG. 10B, in the case shown by solid line a in which reset is carried out, temperature control is not started in the initial state and a frequency change is relatively small. Thus, relatively excellent C/N can be obtained. However, immediately later than that, it is necessary to change the frequency division ratio of second frequency divider 6 based on the result sensed by temperature sensor 8, and then second frequency divider 6 is reset once. Consequently, it is shown that the C/N property is considerably deteriorated as shown in waveform q. Furthermore, the correction interval of temperature control by second frequency divider 6 is as frequent as 50 msec. As a result, before the C/N property is recovered, next control time comes, and bad state of the C/N property may be maintained as shown by waveform r. In a state in which reset occurs frequently in this way, the C/N is not recovered to an excellent state. As a result, a not-excellent state may be maintained. At this time, although the frequency of a local oscillator is adjusted to the desired frequency, the C/N deterioration is caused by frequent reset. In a place in which received power of television is large, reception may be possible even in such a state. However, when the received power becomes smaller, reception may not be carried out, and the minimum input sensitivity property that is a main performance of a receiver may be deteriorated. Note here that the C/N value does not show a perfectly instantaneous value but shows an average value for a certain period. Therefore, as shown in solid line a FIG. 10B in which reset is carried out, the C/N is not substantially changed and is observed in a bad state. This is because the correction interval is short as mentioned above.

On the contrary, in the C/N property of the synthesizer of this exemplary embodiment, the deterioration of the C/N property is hardly observed as shown by solid line b in FIG. 10B. As mentioned above, when a resonator having large frequency-temperature characteristic, for example, an MEMS resonator is used, the synthesizer of this exemplary embodiment is particularly effective.

When the frequency-temperature characteristic is large as in an MEMS resonator, it is possible to reduce the change amount of the frequency division ratio of second frequency divider 6 by reducing the temperature control interval. Therefore, if reset is not carried out (in a state in which the past cumulative addition value is kept) when the frequency division ratio is changed, it is possible to reduce errors in frequency when the frequency division ratio is changed.

Furthermore, a time axis of FIG. 10A showing an example of a quartz-crystal resonator shows a result of monitor of the time axis shorter than that of FIG. 10B as an example of an MEMS resonator for clearly showing the deterioration of C/N.

As is apparent from the above-mentioned example, when second frequency divider 6 is controlled based on the results sensed by temperature sensor 8, a large change in the frequency as in the reception channel switch request is not necessary. Therefore, also in a state in which second frequency divider 6 is not reset and the past cumulative addition value is kept, that is, in a state in which the value is not returned to a preset value, a time to reach a desired frequency division ratio is relatively short.

As described above, by using the synthesizer of this exemplary embodiment, it is possible to suppress deterioration of C/N when the frequency division ratio is changed. For example, in televisions, continuous reception can be achieved without being disconnected. Furthermore, in portable telephones, a complex control is not necessary and a system can be simplified.

Conventionally, when television channels are changed, there is several tens msec to 1 second of waiting time for shifting a channel to the next channel. Therefore, the C/N deterioration does not matter at the time of channel change. This is because television reception is not necessary during the waiting time.

Note here that in portable telephones, signals are not always received. Therefore, by switching the frequency division ratio at a timing in which signals are not received, it is possible to reduce the influence of the C/N deterioration on the reception property. However, it is necessary to control so as to switch the frequency division ratio at the timing in which signals are not received. This may increase burden on a system, make the system complicated, and increase the production cost. By using a method of controlling a second frequency divider like a synthesizer of this exemplary embodiment, it is not necessary to consider the complicated control mentioned above.

This exemplary embodiment describes a case in which reset is not completely carried out. However, the effect that is relatively similar to the above-mentioned effect can be obtained when reset processing is carried out during a term in which effective data, i.e., data that don't directly contribute to BER are transmitted. An example of the term includes a guard interval of an OFDM (Orthogonal Frequency Division Multiple) signal. That is to say, by carrying out reset processing in a part of the guard interval term, it is possible to minimize deterioration of the effective C/N.

Figure 11:
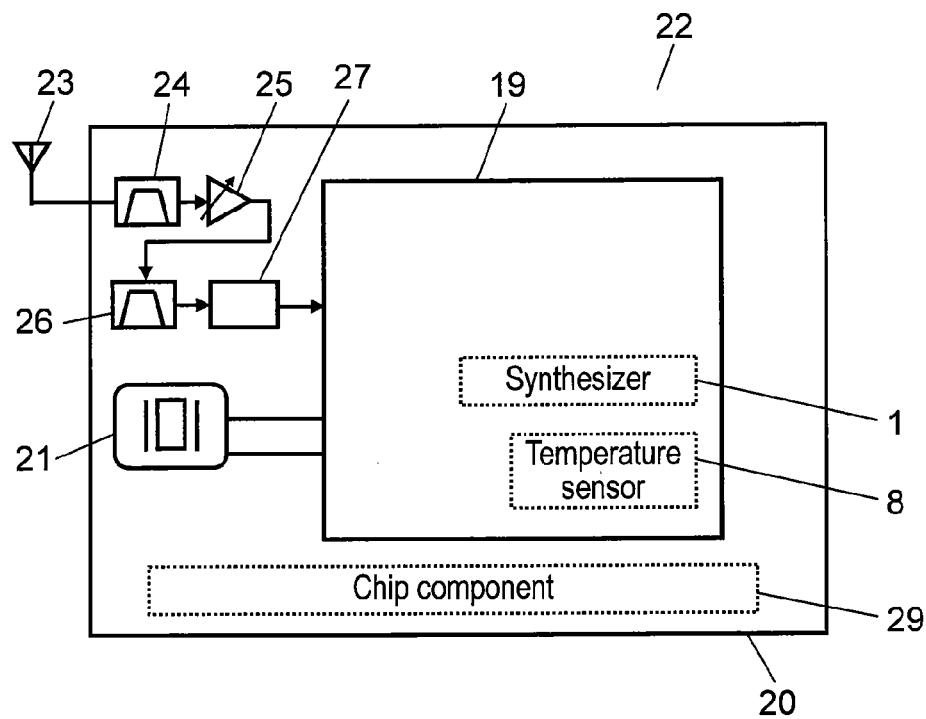
FIG. 11 is a conceptual diagram showing a synthesizer module in accordance with one exemplary embodiment of the present invention.

A module for receiving television using the synthesizer of the present invention is described with reference to FIG. 11. In FIG. 11, synthesizer 1 of the present invention together with temperature sensor 8 are integrated into the same semiconductor IC (integrated circuit) 19 and mounted on base substrate 20. Furthermore, MEMS resonator 21 is used as a component element of the reference oscillator and mounted on base substrate 20. Furthermore, on base substrate 20, chip component 34 such as a bypass capacitor is mounted. When MEMS resonator 21 is used as a component element of the reference oscillator, module for receiving television 22 can be miniaturized. For example, a quartz-crystal resonator needs a size of 2.5×2.0 mm, whereas an MEMS resonator can be formed in a size of 0.5×0.5 mm to 0.3 mm×0.3 mm. Furthermore, the height can be reduced at least by half. Small module for receiving television to be installed in portable telephones has such a small as 9×9 mm to 8×8 mm. Therefore, the above-mentioned size effect is extremely significant.

Other components are described. First filter 24 receiving an input of a received signal received by antenna 23 is mounted. Furthermore, LNA (Low Noise Amplifier) 25 receiving an input of an output signal from first filter 24 is mounted. Furthermore, second filter 26 receiving an input of an output signal from LNA 25 is mounted. Furthermore, balun 27 receiving an input of an output signal from second filter 26 is mounted. Then, an output signal from balun 28 is input into semiconductor IC 19. In FIG. 11, MEMS resonator 21 is used. However, a quartz-crystal resonator may be used unless the above-mentioned effect of small size is needed to be considered.

Figure 12:
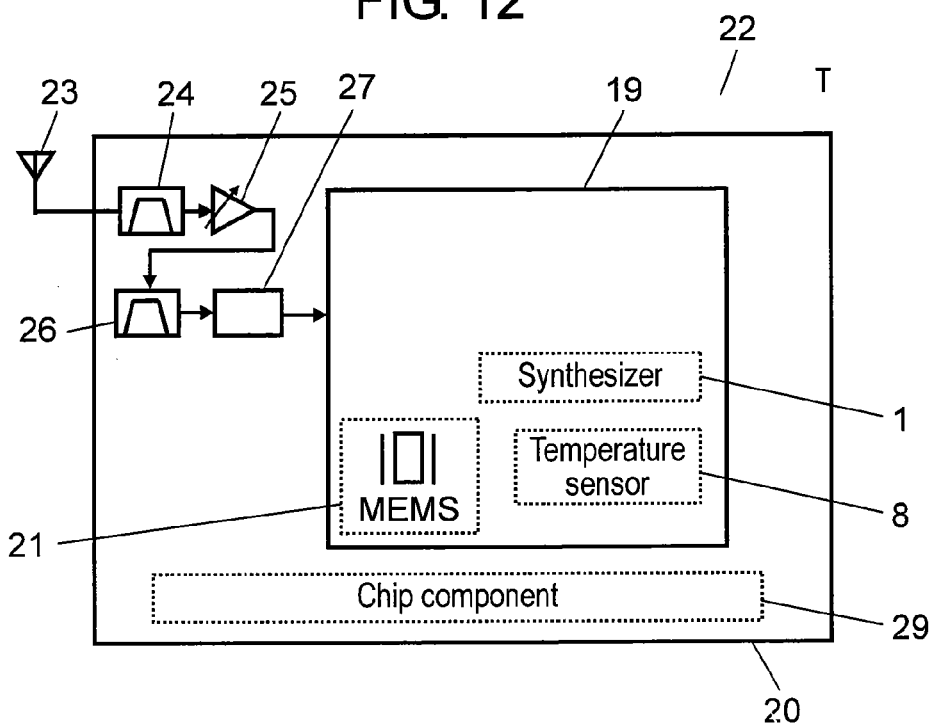
FIG. 12 is another conceptual diagram showing a synthesizer module in accordance with one exemplary embodiment of the present invention.
Figure 13:
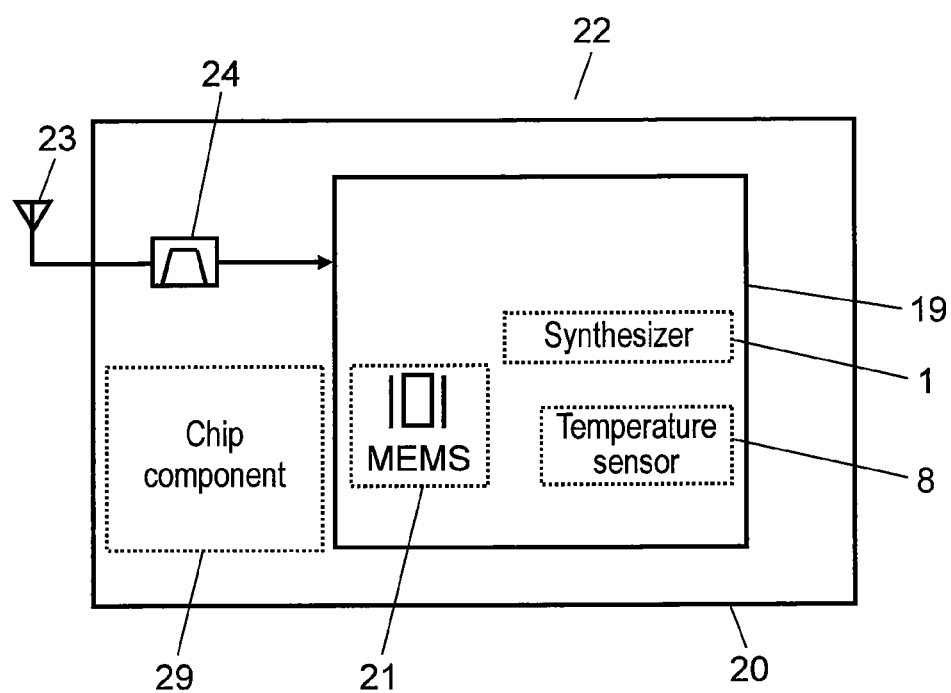
FIG. 13 is still another conceptual diagram showing a synthesizer module in accordance with one exemplary embodiment of the present invention.
Figure 14:
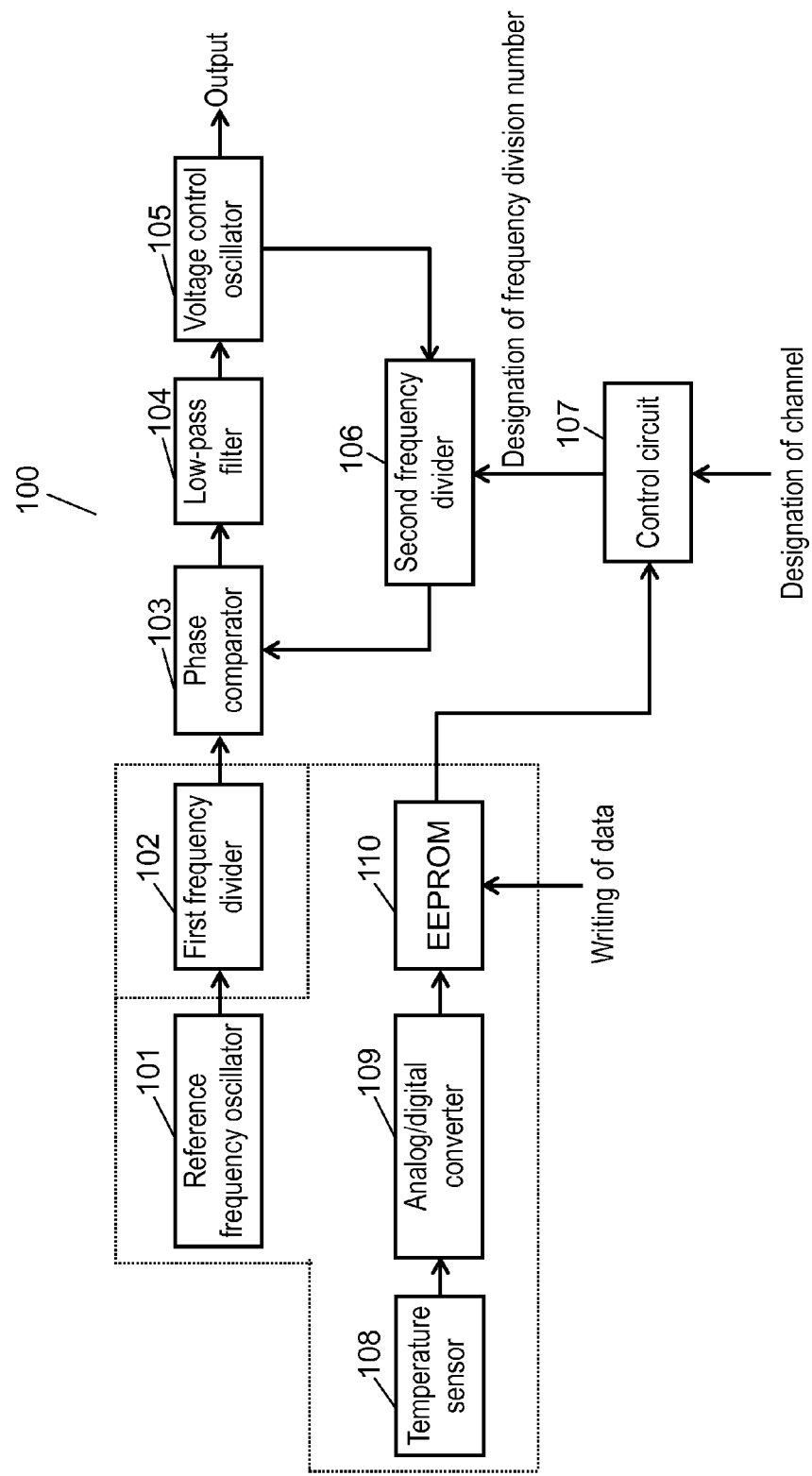
FIG. 14 is a configuration diagram showing a conventional synthesizer.
Figure 15:
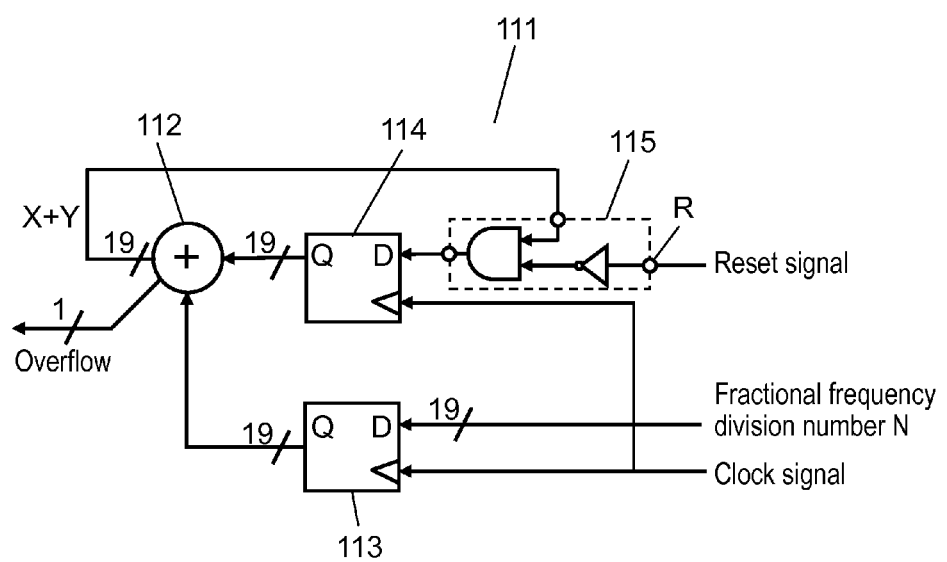
FIG. 15 is a configuration diagram showing an accumulator of a conventional synthesizer.
Figure 16:
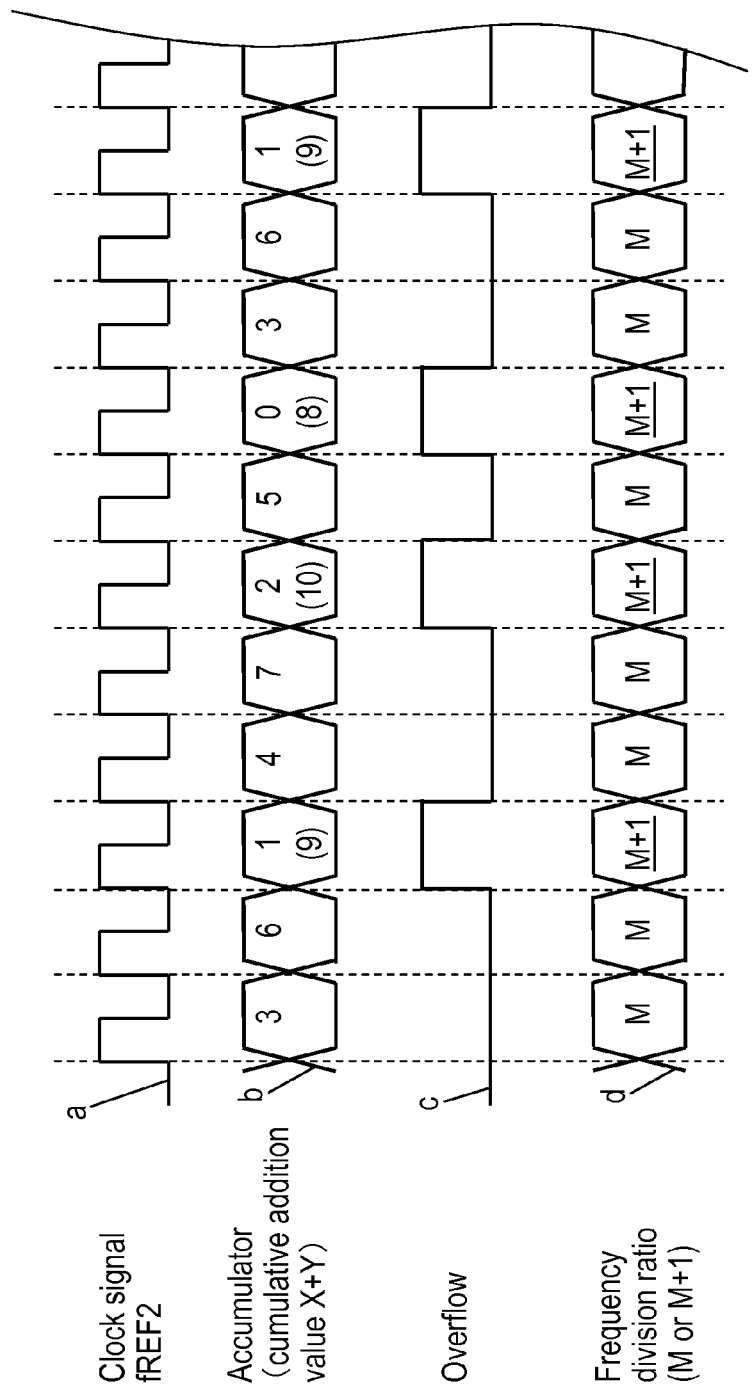
FIG. 16 is a timing chart showing an operation of a frequency divider of a conventional synthesizer.

FIGS. 12 and 13 show an example in which MEMS resonator 21 shown in FIG. 11 is formed in semiconductor IC 19.

In FIG. 12, MEMS resonator 21 is incorporated in semiconductor IC 19. FIG. 13 shows a system configuration in which LNA 25 can be omitted when MEMS resonator 21 is incorporated in semiconductor IC 19, and second filter 26 and balun 27 can be omitted when semiconductor IC 19 is configured.

In this way, MEMS resonator 21 and temperature sensor 8 are built in the same semiconductor IC 19, and thereby an actual temperature of MEMS resonator 21 can be exactly sensed. Therefore, adjusting accuracy of oscillating frequency of an MEMS oscillator can be improved. For example, even if temperatures are suddenly changed, the temperature can be sensed in a state in which delay in temperature transmission hardly occurs. Therefore deterioration of reception by the temperature change is not caused. Furthermore, in particular, in the configuration shown in FIG. 13, since outside configuration elements can be formed in semiconductor IC 19, considerable miniaturization can be achieved and production efficiency can be improved.

In the above-described exemplary embodiment, an output from oscillator 5 is an output from synthesizer 1. However, a frequency divider is provided at the rear part of oscillator 5 and an output from the frequency divider may be an output from synthesizer 1. Thus, the oscillating frequency of oscillator 5 can be made higher, and the size of oscillator 5 can be reduced.

Furthermore, an example of the temperature sensor described in this exemplary embodiment includes a sensor using a temperature property of charge transfer amount of a semiconductor, a thermistor using a property that a resistance value changes with respect to a temperature, and the like. However, the sensor is not necessarily limited to the examples. In short, any sensors may be employed as long as they sense a temperature at which a resonator constituting a reference oscillator is used. The sensor may not directly sense a temperature. It may sense a temperature indirectly.

This exemplary embodiment describes an example in which a frequency error occurring based on a temperature change, that is, an error between the set oscillating frequency and the reference oscillating frequency is corrected. However, the frequency error between the set oscillating frequency and the reference oscillating frequency may be caused also based on factors other than a temperature change. Therefore, frequency errors occurring based on factors other than the temperature change can be corrected by employing the following configuration. That is to say, a frequency error detector is provided in a predetermined place so as to detect a frequency error between the set oscillating frequency and the reference oscillating frequency, and controller 7 may be controlled by the detection result. In this case, it is thought to be practical that the frequency error detector is disposed, for example, between MEMS oscillator 2 and first frequency divider 3, between oscillator 5 and mixer 29, between mixer 29 and signal processing section 32, and the like, in FIG. 1.

Furthermore, the synthesizer of this exemplary embodiment can be used in a wireless device having a plurality of frequency channels. Herein, the "wireless device having a plurality of frequency channels" signifies a wireless system such as a portable telephone and a television receiver for transmitting and receiving signals by the use of a plurality of frequency channels. Conventional wireless devices using a plurality of frequency channels did not have a function of the synthesizer of this exemplary embodiment, that is, a function of "changing a frequency division ratio without returning it to a preset value when the frequency division ratio of a frequency divider (in particular, a fractional frequency divider)." This is because when the frequency division ratio is changed without returning the value to the preset value when channels are switched, an operation of a synthesizer becomes unstable and the frequency division ratio cannot be accurately changed to a desired frequency. The synthesizer of this exemplary embodiment overturns the conventional technology on purpose, and thereby achieves a significant effect capable of reducing a phase noise at the time of switching of the frequency division ratio of the frequency divider according to temperature change. When the frequency division ratio of the frequency divider is switched according to the temperature change, temperature change itself is continuous, and a discontinuous frequency change as in the change of channels does not occur. Therefore, an operation of a synthesizer does not become uncertain.

The above-mentioned exemplary embodiment uses a temperature sensor as a frequency error detector. However the sensor is not necessarily limited to this. In short, any detectors can be used as long as they have a function of directly or indirectly sensing a frequency error of MEMS oscillator 2 that is a reference oscillator. For example, a difference of the frequency of an IF signal as an output of mixer 29 with respect to the predetermined value may be detected. When the frequency of MEMS oscillator 2 is shifted from a predetermined value, an output from synthesizer 1 may be shifted from a predetermined value. Therefore, the frequency obtained by mixing a reception signal of, for example, digital broadcast and an output from a synthesizer by mixer 29 may be shifted from a predetermined value. Thus, this frequency error is preferably detected. As a method of detecting a frequency error, for example, a frequency may be directly detected by frequency discrimination and the like (specifically, a method of detecting a shift from a predetermined value by using a demodulation circuit for FM). Alternatively, a frequency error may be detected by signal processing in a baseband. In this case, a frequency error may be detected from phase information of a pilot signal embedded in a received signal.

Note here that the "preset frequency" in the present invention signifies a predetermined frequency in each part of a reception device. An example of the preset frequency includes a frequency of an output signal of a reference oscillator, a frequency of an IF signal output from a mixer, or the like, which is preset in designing a synthesizer.

Furthermore, the "frequency based on a reference oscillation signal" in the present invention signifies a frequency in each part of a reception device when a synthesizer is actually operated, and an example thereof includes a frequency of an output signal from a reference oscillator, a frequency of an IF signal output from a mixer, or the like.

Note here that the "error between a preset frequency and a frequency based on a reference oscillation signal" in the present invention signifies a difference between the "preset frequency," which has been preliminarily designed in designing a synthesizer, and a frequency when a synthesizer is actually operated, in any parts (for example, at an output side of a mixer) of a reception device.

For example, even if a frequency of a received digital broadcast is shifted from a predetermined value by, for example, Doppler frequency, a frequency error from a predetermined value of a frequency of an IF signal output from a mixer can be detected, and the frequency of an output signal of a synthesizer can be adjusted based on the detected error. Thus, a high receiving quality can be maintained.

According to the present invention, a particularly large effect can be exhibited with respect to resonators whose frequency-temperature characteristic is not excellent for the following reasons. Firstly, the worse the frequency-temperature characteristic is, the more the number of temperature correction is increased. When the number of correction is increased, an adverse effect due to reset may be increased. Secondly, the worse the frequency-temperature characteristic is, the wider a frequency range to be corrected in one control of the frequency division ratio becomes. The frequency range, that is, a difference between a frequency immediately before switching of a fractional frequency division number and a frequency after switching of a fractional frequency division number is increased, so that the frequencies are locked while cycle slip CS is being carried out. Therefore, it takes a longer time to be locked. During this time, a phase noise performance is deteriorated. If the fractional frequency division number is changed within the lock range LR disclosed in the present invention, such a problem can be dissolved.

The frequency-temperature characteristic is additionally described. When a reference temperature is denoted by T0, a current temperature is denoted by T, resonance frequency at reference temperature T0 is denoted by f, and change amount of resonance frequency of a resonator when a temperature is changed from T0 to T is denoted by δf, the frequency change rate with respect to temperatures is represented by the following mathematical formula Math. 3.

$$\delta f/f = \alpha(T-T0) + \beta(T-T0)^2 + \gamma(T-T0)^3$$ [Math. 3]

Note here that $\alpha$, $\beta$ and $\gamma$ are referred to as primary, secondary, and tertiary frequency temperature coefficients, respectively. In detail, δf/f denotes a frequency change rate when the temperature is changed from T0 to T. For example, a quartz-crystal resonator is a resonator in which the primary temperature coefficient is 0, and the secondary and tertiary temperature coefficients are small. In general, the temperature coefficient becomes smaller from primary, secondary, and tertiary coefficients in this order sequentially. Furthermore, the effect of the temperature coefficient on the frequency-temperature characteristic is small in the temperature range in which an electronic device is used. Therefore, the primary temperature coefficient of 0 means that the frequency-temperature characteristic of the resonator is extremely excellent. Temperature coefficients of quartz-crystal are different depending upon a cut angle when a quartz-crystal plate is cut out from a quartz-crystal ingot (a lump after quartz-crystal is pulled). An AT-cut quartz-crystal resonator is one of the quartz-crystal resonators to be used most frequently because it has an excellent frequency-temperature characteristic. For example, the change rate of the frequency in the temperature range (−40 to 85° C.) is about ±20 to ±100 ppm. The range of the change rate of frequency is generated by minute difference in cut angles. On the contrary, most of the MEMS resonators show poor frequency-temperature characteristics. For example, in a silicon resonator, a primary temperature coefficient is large as −30 ppm/° C., and this primary temperature coefficient is dominant in the temperature range in which a resonator is used. In the temperature range for use of −40 to 85° C., the coefficient is 30×125=3750 ppm. This is extremely bad as compared with the coefficient of the AT cut quartz-crystal resonator, about ±20 to ±100 ppm. Therefore, the present invention has a particularly larger effect on a configuration in which an MEMS resonator having a poor frequency-temperature characteristic as compared with a configuration in which a general quartz-crystal resonator is used.

Furthermore, this exemplary embodiment describes a silicon resonator as an example of an MEMS resonator, which uses a semiconductor material as a base material. However, another example of the MEMS resonator includes a resonator using a polysilicon resonator that is the same semiconductor material. Still another example includes so-called FBAR (Film Bulk Acoustic Resonator) including a thin film piezoelectric material such as AlN, ZnO, and PZT as a base, a resonator including a material based on the other thin film such as $SiO_2$, or the like. Furthermore, a further example includes a SAW (Surface Acoustic Wave) resonator using elastic surface wave, and a resonator using a boundary wave transmitting over boundaries of different materials. In these resonators, most of the resonators hardly have the same level of frequency-temperature characteristic as that of the AT-cut quartz-crystal resonator and almost all of them have primary temperature coefficients (not negligible). For example, FBAR using AlN is a resonator using thickness longitudinal vibration (vibration in the direction in which an electric field is applied) and has a temperature coefficient of −25 ppm/° C., and ZnO has a temperature coefficient of about −60 ppm/° C. Furthermore, also in resonators using SAW, a resonator using 36° y-cut lithium tantalite as a base material has a temperature coefficient of about −35 ppm/° C., and a resonator using 64° y-cut lithium niobate as a base material has a temperature coefficient of about −72 ppm/° C.

INDUSTRIAL APPLICABILITY

The present invention can maintain a phase noise good in a synthesizer using, for example, an MEMS resonator, so that it is useful in a synthesizer and an electronic device constituting a reception device.

The invention claimed is:

1. A synthesizer, comprising:
a comparator for receiving a reference oscillation signal from a reference oscillator;
an oscillator for outputting an oscillation signal based on a comparison signal from the comparator;
a frequency divider for dividing a frequency of the oscillation signal from the oscillator responsive to a controller, to form a frequency divided signal, the frequency divider including an accumulator for generating a cumulative addition value during a frequency division ratio based on a frequency division number from the controller; and
a frequency error detector for detecting an error between a preset frequency and the frequency based on the reference oscillation signal,
wherein the comparator compares the frequency divided signal from the frequency divider with the reference oscillation signal from the reference oscillator, and outputs the comparison signal showing a comparison result to the oscillator, and
the controller changes the frequency division ratio of the frequency divider from a first ratio to a second ratio via the accumulator based on the detected error from the frequency error detector, such that a last cumulative addition value of the first ratio is used as an initial addition value of the accumulator for the second ratio.

2. The synthesizer of claim 1,
wherein the frequency division number that changes the frequency division ratio of the frequency divider consists of an integer part and a fractional part, and the controller changes the frequency division ratio in a state in which the fractional part of the frequency division number is kept at a past value.

3. The synthesizer of claim 2,
wherein the controller changes a fractional frequency division number so that a difference between a frequency immediately before switching of the frequency division number of the frequency divider and a frequency after switching of the frequency division number of the frequency divider falls within a lock range.

4. The synthesizer of claim 1,
wherein the frequency division number that changes the frequency division ratio of the frequency divider consists of an integer part and a fractional part,
when the controller changes the frequency division ratio of the frequency divider based on the detected error from the frequency error detector,
in a case in which the controller does not change an integer frequency division number to be input into the integer part but changes only a fractional frequency division number to be input into the fractional part in the frequency division number of the frequency divider, the fractional frequency division number is input into the fractional part in a state in which the fractional part is kept at a past value and the integer frequency division number to be input into the integer part is changed to a larger value than a past value, and
in a case in which the controller arbitrarily changes also the fractional frequency division number to be input into the fractional part, the fractional frequency division number from the controller is input into the fractional part after the fractional part is returned to a minimum value.

5. The synthesizer of claim 1,
wherein the frequency division number that changes the frequency division ratio of the frequency divider consists of an integer part and a fractional part,
when the controller changes the frequency division ratio of the frequency divider based on the detected error from the frequency error detector,
in a case in which the controller does not change an integer frequency division number to be input into the integer part but changes only a fractional frequency division number to be input into the fractional part in the frequency division number of the frequency divider, the fractional frequency division number is input into the fractional part in a state in which the fractional part is kept at a past value and the integer frequency division number to be input into the integer part is changed to a smaller value than a past value, and
in a case in which the controller arbitrarily changes also the fractional frequency division number to be input into the fractional part, the fractional frequency division number from the controller is input into the fractional part after the fractional part is returned to a maximum value.

6. The synthesizer of claim 1,
wherein the reference oscillator includes a micro electro mechanical system element.

7. The synthesizer of claim 1,
wherein the frequency error detector detects the error between the preset frequency and the frequency based on the reference oscillation signal based on an output signal from a temperature sensor for detecting a temperature.

8. A synthesizer module comprising:
a synthesizer of claim 1, and
a reference oscillator formed of a resonator including a micro electro mechanical system element,
wherein an output signal from the reference oscillator is input into the comparator.

9. The synthesizer module of claim 8,
wherein the synthesizer and the resonator including the micro electro mechanical system element are formed on a same semiconductor substrate.

10. A reception device comprising:
a synthesizer of claim 1, and
a mixer for converting a frequency of a received signal based on the oscillation signal from the synthesizer.

11. The reception device of claim 10,
wherein a change in a frequency of the reference oscillation signal from the reference oscillator is based on an output signal from the synthesizer.

12. The reception device of claim 10,
wherein when the frequency of the received signal is switched, the controller changes the frequency division ratio of the frequency divider in a state in which the frequency division ratio is returned to a preset value.

13. The reception device of claim 10,
wherein the frequency division number that changes the frequency division ratio of the frequency divider consists of an integer part and a fractional part, and
when the frequency of the received signal is switched, the integer part is changed, and
when the frequency division ratio of the frequency divider is changed based on the detected error from the frequency error detector, the fractional part is changed.

14. The reception device of claim 10,
wherein during a term in which the controller determines that predetermined data are not received, the controller changes the frequency division ratio by returning it to a preset value, and during a term in which the controller determines that predetermined data are received, the controller changes the frequency division ratio without returning it to the preset value and in a state in which a past value is kept.

15. The reception device of claim 14,
wherein the term in which the controller determines that predetermined data are not received is a guard interval term.

16. An electronic device comprising:
a wireless device including a synthesizer of claim 1 and which transmits and receives a signal by using a plurality of frequency channels.

17. An electronic device comprising:
a synthesizer of claim 1;
a mixer for converting a frequency of a received signal based on the oscillation signal from the synthesizer;
a signal processing section connected to an output side of the mixer; and
a display section connected to an output side of the signal processing section.

* * * * *